(12) United States Patent
Hirosaki et al.

(10) Patent No.: US 8,206,887 B2
(45) Date of Patent: *Jun. 26, 2012

(54) POSITIVE RESIST COMPOSITION AND RESIST PATTERN FORMING METHOD

(75) Inventors: Takako Hirosaki, Kanagawa-ken (JP); Daiju Shiono, Kanagawa-ken (JP); Taku Hirayama, Kanagawa-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 7 days.

This patent is subject to a terminal disclaimer.

(21) Appl. No.: 11/914,451

(22) PCT Filed: Apr. 26, 2006

(86) PCT No.: PCT/JP2006/308751
§ 371 (c)(1),
(2), (4) Date: Nov. 14, 2007

(87) PCT Pub. No.: WO2006/123523
PCT Pub. Date: Nov. 23, 2006

(65) Prior Publication Data
US 2009/0092921 A1 Apr. 9, 2009

(30) Foreign Application Priority Data
May 17, 2005 (JP) ................................. 2005-144391

(51) Int. Cl.
G03C 1/00 (2006.01)
G03F 7/00 (2006.01)

(52) U.S. Cl. ..................................... 430/270.1; 430/326

(58) Field of Classification Search ................ 430/270.1, 430/326
See application file for complete search history.

(56) References Cited

U.S. PATENT DOCUMENTS

| | | | |
|---|---|---|---|
| 4,465,765 A | 8/1984 | Leppard et al. | |
| 5,286,600 A | 2/1994 | Ochiai et al. | |
| 5,389,491 A | 2/1995 | Tani et al. | |
| 5,658,706 A | 8/1997 | Niki et al. | |
| 5,693,452 A | 12/1997 | Aoai et al. | |
| 5,707,776 A * | 1/1998 | Kawabe et al. | 430/270.1 |
| 5,824,451 A | 10/1998 | Aoai et al. | |
| 5,837,420 A | 11/1998 | Aoai et al. | |
| 5,844,057 A | 12/1998 | Watanabe et al. | |
| 5,994,025 A | 11/1999 | Iwasa et al. | |
| 6,037,098 A | 3/2000 | Aoai et al. | |
| 6,106,993 A | 8/2000 | Watanabe et al. | |
| 6,165,677 A | 12/2000 | Yako | |
| 6,197,473 B1 | 3/2001 | Kihara et al. | |
| 6,638,683 B1 * | 10/2003 | Tan et al. | 430/270.1 |
| 7,220,808 B2 | 5/2007 | Yamagishi et al. | |
| 7,504,196 B2 | 3/2009 | Shiono et al. | |
| 2002/0025495 A1 | 2/2002 | Ogata et al. | |
| 2002/0058205 A1 | 5/2002 | Nakashima et al. | |
| 2003/0232277 A1 | 12/2003 | Sasaki et al. | |
| 2004/0005512 A1 | 1/2004 | Mizutani et al. | |
| 2004/0234885 A1 | 11/2004 | Watanabe et al. | |
| 2005/0058935 A1 | 3/2005 | Kishimura et al. | |
| 2005/0130057 A1 | 6/2005 | Sudo et al. | |
| 2005/0271971 A1 | 12/2005 | Ueda et al. | |
| 2007/0059632 A1 | 3/2007 | Oguro et al. | |
| 2007/0259273 A1 | 11/2007 | Shiono et al. | |
| 2007/0281243 A1 | 12/2007 | Hirayama | |
| 2008/0020288 A1 | 1/2008 | Hirayama et al. | |
| 2008/0145784 A1 | 6/2008 | Shiono et al. | |
| 2009/0117488 A1 | 5/2009 | Hirosaki et al. | |
| 2009/0162781 A1 | 6/2009 | Shiono et al. | |

FOREIGN PATENT DOCUMENTS

| | | |
|---|---|---|
| CN | 1611490 | 5/2005 |
| JP | A-59-053846 | 3/1984 |
| JP | H05-061197 | 3/1993 |
| JP | H05-249681 | 9/1993 |
| JP | A-06-083055 | 3/1994 |
| JP | H06-059444 | 3/1994 |
| JP | H06-167811 | 6/1994 |
| JP | 06-266109 A | 9/1994 |
| JP | A-08-123031 | 5/1996 |
| JP | 08-193054 | 7/1996 |
| JP | H08-220740 | 8/1996 |
| JP | H08-262712 | 10/1996 |
| JP | H08-337616 | 12/1996 |
| JP | H09-005999 | 1/1997 |
| JP | H09-160246 | 6/1997 |
| JP | A-09-211865 | 8/1997 |

(Continued)

OTHER PUBLICATIONS

Hirayama et al., "Development of Amorphous PolyPhenol Resists with Low Molecular Weight and Narrow Dispersion for EB Lithography", ISEEE Xplore, Oct. 22, 2004, pp. 10-11.*
Office Action issued in corresponding Japanese Patent Application No. 2004-260764, dated Mar. 3, 2009.
Office Action issued Sep. 16, 2008 on the counterpart Korean Patent Application No. 10-2007-7010473.
Decision to Grant a Patent issued on Jan. 6, 2009 in Japanese Patent Application No. 2004-182301.

(Continued)

*Primary Examiner* — Cynthia Kelly
*Assistant Examiner* — Connie P Johnson
(74) *Attorney, Agent, or Firm* — Knobbe Martens Olson & Bear LLP

(57) ABSTRACT

A positive resist composition includes a base material component (A) which exhibits increased alkali solubility under an action of an acid, and an acid generator component (B) which generates an acid upon exposure, wherein the base material component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups, and the compound (A1) exhibits a standard deviation ($s_n$) of the number of protective groups per molecule of less than 1, or exhibits a standard deviation ($s_p$) of a protection ratio (mol %) per molecule of less than 16.7.

10 Claims, No Drawings

FOREIGN PATENT DOCUMENTS

| | | |
|---|---|---|
| JP | A-09-211866 | 8/1997 |
| JP | 10-123703 A | 5/1998 |
| JP | 2002-099088 | 5/1998 |
| JP | H10-274845 | 10/1998 |
| JP | A-11-153863 | 6/1999 |
| JP | H11-167199 | 6/1999 |
| JP | H11-199533 | 7/1999 |
| JP | 2000-086584 | 3/2000 |
| JP | 2000-305270 | 11/2000 |
| JP | 2000-330282 | 11/2000 |
| JP | 2001-312055 A | 11/2001 |
| JP | 2002-055452 | 2/2002 |
| JP | 2002-99089 | 4/2002 |
| JP | 2002-221787 | 8/2002 |
| JP | A-2002-328473 | 11/2002 |
| JP | 2003-30282 | 1/2003 |
| JP | A-2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | A-2004-191913 | 7/2004 |
| JP | 2004-302440 | 10/2004 |
| JP | 2004-359590 | 12/2004 |
| JP | 2005-089387 | 4/2005 |
| JP | 2005-091909 | 4/2005 |
| JP | 2005-309421 | 11/2005 |
| JP | A-2007-015944 | 1/2007 |
| KR | 0231242 | 5/1997 |
| KR | 2001-0088341 | 9/2001 |
| KR | 10-0406242 | 11/2003 |
| TW | 200302397 A | 8/2003 |
| TW | 200617602 | 6/2006 |
| WO | WO 2003/069412 A1 | 8/2003 |
| WO | WO 2005/029189 A1 | 3/2005 |
| WO | WO 2006/046383 | 5/2006 |

OTHER PUBLICATIONS

Hirayama et al. "Development of Electron Beam Resists Based on Amorphous Polyphenols with Low Molecular Weight and Narrow Dispersion" Proceedings of SPIE, vol. 5753, pp. 738-745.

Hirayama et al., Journal of Photopolymer Science and Technology, vol. 17, No. 3, 435-440, (2004).

Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488 (published on Jul. 26, 2005).

International Search Report from PCT/JP2005/018143 dated Nov. 15, 2005.

International Search Report in connection with corresponding PCT application No. PCT/JP2006/313103, dated Sep. 26, 2006.

International Search Report issued in corresponding PCT application No. PCT/JP2006/302271, mailed on Mar. 7, 2006.

International Search Report issued in corresponding PCT application No. PCT/JP2006/311443, dated Jun. 7, 2006.

International Search Report issued in corresponding PCT application No. PCT/JP2006/301679, dated Feb. 16, 2006.

Notice of Allowance issued on related Korean Patent Application No. 10-2009-7006750, dated Feb. 16, 2010.

Office Action issued in counterpart Japanese Patent Application No. 2005-026266, dated Mar. 3, 2009.

Office Action issued in counterpart Korean Patent Application No. 10-2007-7017441, dated May 7, 2009.

Office Action issued on Apr. 14, 2008 on counterpart Korean Patent Application No. 10-2007-7004390.

Office Action issued on Aug. 26, 2008, on counterpart Japanese Patent Application No. 2004-182301.

Office Action issued on counterpart Japanese Patent Application No. JP 2005-050721, dated Jul. 28, 2009.

Office Action issued on counterpart Japanese Patent Application No. JP 2005-050721, dated Mar. 3, 2009.

Office Action issued on Jun. 3, 2008, on counterpart Japanese Application No. 2004-182301.

Office Action issued on Jun. 5, 2008 on counterpart Korean Patent Application No. 10-2007-7019433.

Office Action issued on Korean Patent Application No. 10-2007-7004390, dated Dec. 17, 2008.

Office Action issued on Korean Patent Application No. 10-2008-7025851, dated Jan. 7, 2009.

Office Action and search report issued on May 12, 2008, on the counterpart Taiwanese Patent Application No. 094104523.

Office Action issued on May 27, 2008, on counterpart Japanese Application No. 2004-182300.

Yamaguchi et al., Linewidth fluctuations caused by polymer aggregates in resist films, Journal of Photopolymer Science and Technology, vol. 10 No. 4, pp. 635-640, (1997).

International Search Report issued in corresponding PCT application No. PCT/JP2005/013564, mailed Sep. 6, 2005.

European Search Report issued in European Patent Application No. EP 10194369.4, dated Feb. 17, 2011.

Office Action in corresponding European Patent Application No. 06732357.6 dated Aug. 15, 2011.

Office Action in corresponding Chinese Patent Application No. 200680016732.3 dated Aug. 24, 2011.

Notice of Allowance in corresponding Japanese Patent Application No. 2005-212904 dated Sep. 20, 2011.

\* cited by examiner

POSITIVE RESIST COMPOSITION AND RESIST PATTERN FORMING METHOD

RELATED APPLICATIONS

This application is the U.S. National Phase filing under 35 U.S.C. §371 of PCT/JP2006/308751, filed Apr. 26, 2006, which designated the United States and was published in a language other than English, which claims priority under 35 U.S.C. §119(a)-(d) to Japanese Patent Application No. 2005-144391 filed May 17, 2005. The content of these applications is incorporated herein by reference in their entireties.

TECHNICAL FIELD

The present invention relates to a positive resist composition and a method for forming a resist pattern.

BACKGROUND ART

In recent years, in the production of semiconductor elements and liquid crystal display elements, advances in lithography techniques have lead to rapid progress in the field of miniaturization.

Typically, these miniaturization techniques involve shortening the wavelength of the exposure light source. Specifically, ultraviolet radiation such as g-line and i-line radiation has conventionally been used, but nowadays KrF excimer lasers and ArF excimer lasers have begun to be introduced in mass production of semiconductor elements. Also, radiations having a shorter wavelength than that of these excimer lasers, for example, $F_2$ excimer laser, electron beams, EUV (extreme ultraviolet), and X-ray are also being examined.

One example of a pattern forming materials that can form a pattern of minute dimensions is a chemically amplified resist composition including a base material having film formability and an acid generator which generates an acid upon exposure. Chemically amplified resists include negative resists in which alkali solubility decreases upon exposure, and positive resists in which alkali solubility increases upon exposure.

Polymers have conventionally been used as a base material component of these chemically amplified photoresists. For example, there have been used polyhydroxystyrene (PHS) or a PHS-based resin in which a portion of the hydroxyl groups are substituted with acid dissociable, dissolution inhibiting groups, and a copolymer derived from a (meth)acrylate ester or a resin in which a portion of the carboxyl groups are substituted with acid dissociable, dissolution inhibiting groups.

However, when a pattern is formed using such a pattern forming material, there is a problem that roughness occurs on the surface of a top face and a side wall of the pattern. For example, roughness on the surface of the side wall of the resist pattern, namely, line edge roughness (LER) is causative of distortion around holes in a hole pattern and unevenness of a line width in a line-and-space pattern and thus it may exert an adverse influence on formation of minute semiconductor devices Such a problem becomes more severe as the pattern size becomes smaller. Therefore, since lithography using electron beams and EUV aims at forming a pattern of minute dimensions of several tens of nanometers, ultralow roughness more than the present pattern roughness is required.

However, polymers used as the base material usually have a large molecular size (mean square radius per molecule) such as about several tens of nanometers. In a developing step of pattern formation, development of a resist to be dissolved in a developing solution is usually performed in one molecular unit of a base material component. Therefore, so long as a polymer is used as a base material component, it is very difficult to further reduce the roughness.

To cope with such problems, there is proposed, as the material aiming at ultralow roughness, a resist in which a low molecular material is used as the base material component. For example, patent documents 1 and 2 propose a low molecular material containing alkali-soluble groups, such as hydroxyl groups, in which either a portion of, or all of, the groups are protected with acid dissociable, dissolution inhibiting groups. It is expected that such a low molecular material can reduce the roughness because of the small molecular size attributed to a low molecular weight.

(Patent Document 1)
Japanese Unexamined Patent Application, First Publication No. 2002-099088
(Patent Document 2)
Japanese Unexamined Patent Application, First Publication No. 2002-099089

DISCLOSURE OF THE INVENTION

Problems to be Solved by the Invention

However, it is actually difficult to form a resist pattern having reduced roughness on a practical level using such a material. For example, there is a problem that a pattern itself cannot be formed, or the roughness cannot be sufficiently reduced even if the pattern can be formed, and the shape cannot be sufficiently retained.

The present invention has been made so as to solve the above problems, with an object of providing a positive resist composition which enables formation of a resist pattern having reduced roughness, and a method for forming a resist pattern.

Means for Solving the Problem

The present inventors have paid attention to a protection state of phenolic hydroxyl groups of a base material component in a molecular level and intensively studied, and found that the above object can be achieved by a compound in which phenolic hydroxyl groups of a polyhydric phenol compound having a specific molecular weight are protected with a specific number of protective groups and/or a protection ratio, and thus the present invention has been completed.

In a first aspect of the present invention, the positive resist composition includes a base material component (A) which exhibits increased alkali solubility under an action of an acid, and an acid generator component (B) which generates an acid upon exposure, wherein the base material component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups, and the compound (A1) exhibits a standard deviation ($s_n$) of the number of protective groups per molecule of less than 1.

In a second aspect of the present invention, the positive resist composition includes a base material component (A) which exhibits increased alkali solubility under an action of an acid, and an acid generator component (B) which generates an acid upon exposure, wherein the base material component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups, and the compound (A1) exhibits standard deviation ($s_p$) of a protection ratio (mol %) per molecule of less than 16.7.

In a third aspect of the present invention, the method for forming a resist pattern includes the steps of forming a resist film on a substrate using a positive resist composition according to the first aspect; exposing the resist film; and developing the resist film, thereby forming a resist pattern.

In a fourth aspect of the present invention, the method for forming a resist pattern includes the steps of forming a resist film on a substrate using a positive resist composition according to the second aspect; exposing the resist film; and developing the resist film, thereby forming a resist pattern.

In the present invention, "exposure" is used as a general concept which includes the entire irradiation of the radiation.

The present invention can provide a positive resist composition which enables formation of a resist pattern having reduced roughness, and a method for forming a resist pattern.

BEST MODE FOR CARRYING OUT THE INVENTION (Positive Resist Composition as First Aspect)

The positive resist composition of the present invention includes a base material component (A) which exhibits increased alkali solubility under an action of an acid (hereinafter referred sometimes to as component (A)) and an acid generator component (B) which generates an acid upon exposure (hereinafter referred sometimes to as component (B)).

In the component (A), when an acid generated from the component (B) upon exposure, this acid causes the entire component (A), to change to an alkali-soluble state from an alkali-insoluble state. Therefore, when a resist film made of the positive resist composition is selectively exposed in formation of a resist pattern, or heated after the exposure, the exposed portions are changed to an alkali-soluble state, whereas, the unexposed portions are maintained as an alkali-insoluble state. Thus, a positive resist pattern can be formed by alkali-developing.

(Component (A))

In the positive resist composition of the present invention, it is necessary that the component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups.

There are no particular restrictions on the polyhydric phenol compound (a) (in a state where any hydrogen atoms of phenolic hydroxyl groups are not protected with acid dissociable, dissolution inhibiting groups) that constitutes the compound (A1) provided that it is a polyhydric phenol compound containing two or more phenolic hydroxyl groups and has a molecular weight of 300 to 2,500. For example, it is possible to use a polyhydric phenol compound which is known as a sensitizer or a heat resistance improver in a non-chemically amplified g-ray or i-ray resist.

Examples of the polyhydric phenol compound include bis (2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis (4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis (4-hydroxy-3-methylphenyl)-2-hydroxyphenylmethane, bis (3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenyl-methane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl) ethyl]benzene, and four benzene ring type phenol compounds of formalin condensates of phenols such as phenol, m-cresol, p-cresol, and xylenol.

The number of the phenolic hydroxyl group of the polyhydric phenol compound (a) (in a state where any hydrogen atoms of phenolic hydroxyl groups are not protected with acid dissociable, dissolution inhibiting groups) that constitutes the compound (A1) is preferably 3 or more, more preferably from 4 to 20, and most preferably from 6 to 18, in terms of achieving excellent effects for the present invention.

In the present invention, the polyhydric phenol compound (a) is particularly preferably at least one kind selected from the group consisting of polyhydric phenol compounds represented by general formulas (I), (II), and (III) shown below. When the polyhydric phenol compound has a benzene ring (which may include a substituent) structure containing hydroxyl groups shown below, excellent effects for the present invention are achieved. The reason is considered as follows. That is, when the compound has such a structure, the function capable of forming a film having high amorphous properties and excellent stability is exerted.

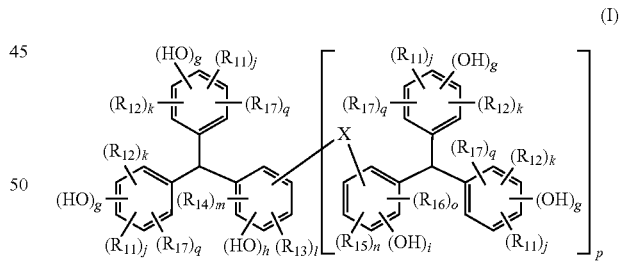

(I)

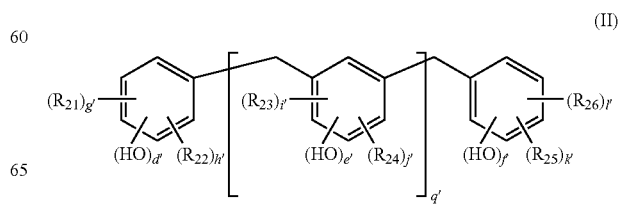

(II)

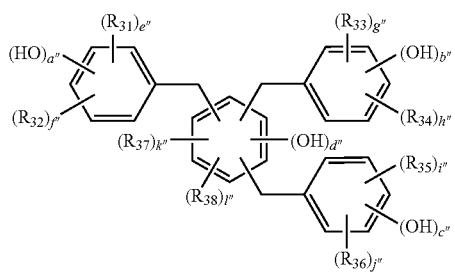

(III)

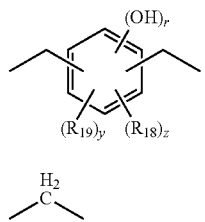

(Ia)

(Ib)

In general formula (I) shown above, $R_{11}$ to $R_{17}$ each represents, independently, a straight-chain, branched-chain, or a cyclic lower alkyl group of 1 to 10 carbon atoms, preferably 1 to 5 carbon atoms, a cyclic alkyl group of 5 to 6 capon atoms, or an aromatic hydrocarbon group. The alkyl group or the aromatic hydrocarbon group may include a hetero atom such as an oxygen atom, a nitrogen atom, or a sulfur atom in the structure. The aromatic hydrocarbon group is an aromatic hydrocarbon group of 6 to 15 carbon atoms, and examples thereof include a phenyl group, a tolyl group, a xylyl group, a mesityl group, a phenethyl group, and a naphthyl group.

g and j each represents, independently, an integer of 1 or more, and preferably from 1 to 2, k and q each represents, independently, an integer of 0 or 1 or more, and preferably an integer of 0 or 1 or more and is less than 2, and g+j+k+q is 5 or less.

h is an integer of 1 or more, and preferably from 1 to 2, l and m each represents, independently, an integer of 0 or 1 or more, and preferably an integer of 0 or 1 or more and is less than 2, and h+l+m is 4 or less.

i is an integer of 1 or more, preferably from 1 to 2, n and o each represents, independently, an integer of 0 or 1 or more, and preferably an integer of 0 or 1 or more and is less than 2, and i+n+o is 4 or less.

p is 0 or 1, and preferably 1.

X is a group represented by general formula (Ia) or (Ib) shown below:

(in formula (Ia), $R_{18}$ and $R_{19}$ each represents, similar to $R_{11}$ to $R_{17}$, independently, an alkyl group or an aromatic hydrocarbon group of 1 to 10 carbon atoms, and may include a hetero atom in the structure; and r, y, and z each represents, independently, an integer of 0 or 1 or more, and r+y+z is 4 or less).

Of these compounds, the compound is preferably a compound in which $R_{11}$ is a cycloalkyl group, j is 1, $R_{12}$ is a lower alkyl group, k is 1, and g is 1.

The compound is more preferably a compound in which $R_{11}$ is a cycloalkyl group, j is 1, $R_{12}$ is a lower alkyl group, k is 1, g is 1, q, l, m, n, and o simultaneously represent 0, and h and i simultaneously represent 0 because a pattern of minute dimensions, which has reduced LER and high resolution, can be formed.

X is most preferably a group represented by general formula (Ib) shown above because it is easily synthesized.

Of the polyhydric phenol compounds represented by general formula (I) shown above, polyhydric phenol compounds represented by formulas (I-1), (I-2), (I-3), and (I-4) are most preferred.

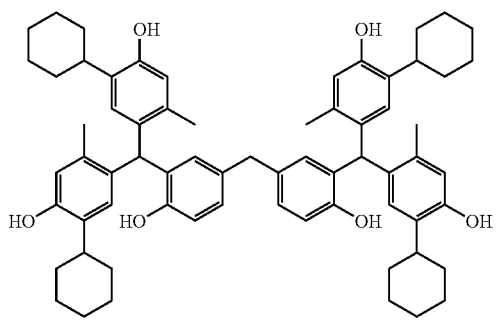

(I-1)

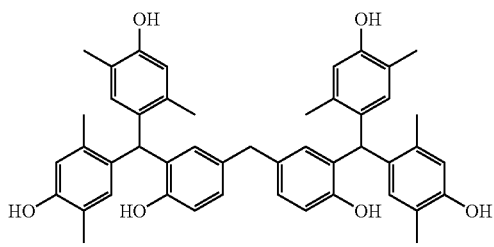

(I-2)

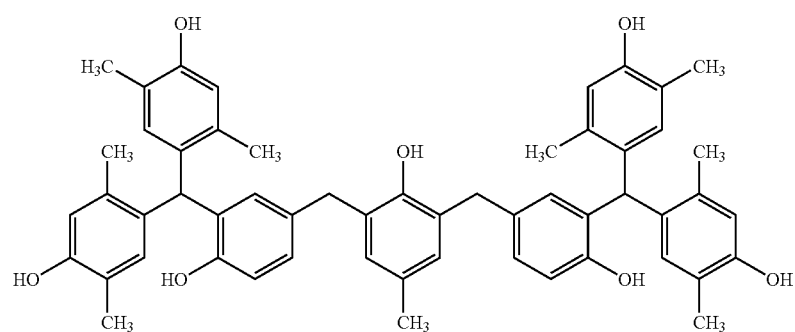

(I-3)

-continued (I-4)

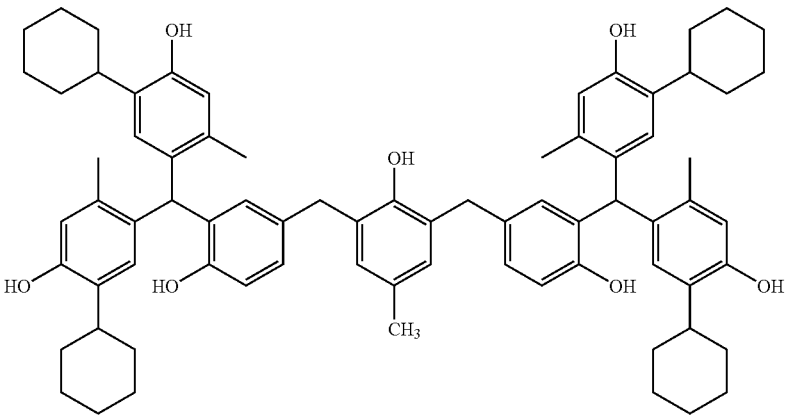

In general formula (II) shown above, $R_{21}$ to $R_{26}$ each represents, independently, a straight-chain, branched-chain, or a cyclic lower alkyl group of 1 to 10 carbon atoms, and preferably 1 to 5 carbon atoms, a cyclic alkyl group of 5 to 6 carbon atoms, or an aromatic hydrocarbon group. The alkyl group or the aromatic hydrocarbon group may include a hetero atom such as an oxygen atom, a nitrogen atom, or a sulfur atom in the structure. The aromatic hydrocarbon group is an aromatic hydrocarbon group of 6 to 15 carbon atoms, and examples thereof include a phenyl group, a tolyl group, a xylyl group, a mesityl group, a phenethyl group, and a naphthyl group. It is preferred that all of $R_{21}$ to $R_{26}$ are preferably lower alkyl groups.

d' and g' each represents, independently, an integer of 1 or more, and preferably from 1 to 2, and h' is an integer of 0 or 1 or more, and preferably an integer of 0 or 1 or more and is less than 2, and d'+g'+h' is 5 or less.

e' is an integer of 1 or more, and preferably from 1 to 2, i' and j' each represents, independently, an integer of 0 or 1 or more, and preferably an integer of 0 or 1 or more and is less than 2, and e'+i'+j' is 4 or less.

f' and k' each represents, independently, an integer of 1 or more, and preferably from 1 to 2, l' is an integer of 0 or 1 or more, and preferably an integer of 0 or 1 or more and is less than 2, and f'+k'+l' is 5 or less.

q' is an integer from 1 to 20, and preferably from 2 to 10.

In general formula (III) shown above, $R_{31}$ to $R_{36}$ each represents, independently, a straight-chain, branched-chain, or a cyclic lower alkyl group of 1 to 10 carbon atoms, and preferably 1 to 5 carbon atoms, a cyclic alkyl group of 5 to 6 carbon atoms, or an aromatic hydrocarbon group. The alkyl group or the aromatic hydrocarbon group may include a hetero atom such as an oxygen atom, a nitrogen atom, or a sulfur atom in the structure. The aromatic hydrocarbon group is preferably an aromatic hydrocarbon group of 6 to 15 carbon atoms, and examples thereof include a phenyl group, a tolyl group, a xylyl group, a mesityl group, a phenethyl group, and a naphthyl group. It is preferred that all of $R_{31}$ to $R_{36}$ are lower alkyl groups.

a" and e" each represents, independently, an integer of 1 or more, and preferably from 1 to 2, f" is an integer of 0 or 1 or more, and preferably an integer of 0 or 1 or more and is less than 2, and a"+e"+f" is 5 or less.

b" and h" each represents, independently, an integer of 1 or more, and preferably from 1 to 2, g" is an integer of 0 or 1 or more, and preferably an integer of 0 or 1 or more and is less than 2, and b"+h"+g" is 5 or less.

c" and i" each represents, independently, an integer of 1 or more, and preferably from 1 to 2, j" is an integer of 0 or 1 or more, and preferably an integer of 0 or 1 or more and is less than 2, and c"+i"+j" is 5 or less.

d" is an integer of 1 or more, and preferably from 1 to 2, k" and l" each represents, independently, an integer of 0 or 1 or more, and preferably an integer of 0 or 1 or more and is less than 2, and d"+k"+l" is 3 or less.

In the present invention, the polyhydric phenol compound (a) must has a molecular weight within a range from 300 to 2,500, preferably from 450 to 1,500, and more preferably from 500 to 1,200. When the molecular weight is the upper limit or less, the roughness is reduced and the pattern shape is further improved, and also the resolution is improved. In contrast, when the molecular weight is the lower limit or more, a resist pattern having a good profile shape can be formed.

The polyhydric phenol compound (a) preferably has a dispersion degree (Mw/Mn) of the molecular weight of 1.5 or less in terms of achieving excellent effects for the present invention. The reason is considered as follows. Narrow molecular weight distribution, namely, a dispersion degree of 1.5 or less of the polyhydric phenol compound (a) enables comparatively uniform alkali solubility of each compound (A1) even if a polyhydric phenol material contains, as the compound (A1), plural kinds of compounds each containing a different number (the number of protective groups) of phenolic hydroxyl groups protected with acid dissociable, dissolution inhibiting groups. The smaller the dispersion degree, the better, and the dispersion degree is more preferably 1.4 or less, and most preferably 1.3 or less.

The term "dispersion degree" is usually used in a polydispersed compound. Even in the case of a monodispersed compound, when the compound is analyzed using gel permeation chromatography (GPC) in the presence of by-products produced during the production and impurities such as a residual starting material, molecular weight distribution may be apparently produced. Namely, the dispersion degree of 1 in the case of the monodispersed compound means that purity is 100%, and the larger the dispersion degree, the more the amount of impurities.

In the present invention, the dispersion degree can be determined as follows. Using a method for measurement of the weight average molecular weight (Mw) and the number average molecular weight (Mn) of a polymer, which is usually used for a compound showing an apparent molecular weight distribution, such as GPC, Mw and Mn are measured and the ratio Mw/Mn is calculated.

The dispersion degree of the polyhydric phenol compound (a) can be adjusted by removing reaction by-products and impurities through purification and removing unnecessary portions using a known method such as a molecular weight fractionation treatment after synthesizing the polyhydric phenol compound (a) as a final objective product.

The polyhydric phenol compound (a) is a material which can form an amorphous film by a spin coating method. As used herein, amorphous film means a non-crystallizable and optically transparent film. The spin coating method is one of usually used thin film forming methods.

It is possible to discriminate whether or not a polyhydric phenol compound can form an amorphous film using a spin coating method by confirming whether or not the entire coating film formed on an 8 inch silicone wafer using a spin coating method is transparent. More specifically, discrimination can be performed as follows. First, the polyhydric phenol material is dissolved in a mixed solvent having a concentration of 14 mass %, which is prepared by using solvents used usually in a resist solvent, for example, ethyl lactate and propylene glycol monomethyl ether acetate (mass ratio: 40/60) (hereinafter abbreviated to EM), by subjecting to an ultrasonic treatment (dissolution treatment) using an ultrasonic cleaner. The solution is spin-coated on a wafer at 1,500 rpm and then optionally baked dry (PAB, Post Applied Bake) under the conditions of a temperature of 110° C. for 90 seconds. It is confirmed whether or not an amorphous film is formed by visually observing the transparency of the film. An opaque film, which is not transparent, is not the amorphous film.

In the present invention, the polyhydric phenol compound (a) is preferably an amorphous film having excellent stability, for example, an amorphous state is maintained even after the film is allowed to stand under a room temperature environment for 2 weeks after PAB.

The compound (A1) is a compound in which either a portion of, or all of, the hydrogen atoms of the phenolic hydroxyl groups of the polyhydric phenol compound (a) are protected with acid dissociable, dissolution inhibiting groups. The acid dissociable, dissolution inhibiting groups are groups which have alkali dissolution inhibition properties that cause the entire component (A) to change to an alkali-insoluble state before dissociation, and which cause the entire compound (A1) to change to an alkali-soluble state after dissociation. Therefore, in the case where the compound (A1) is mixed with the positive resist composition, together with the component (B), an acid generated from the acid generator component (B) causes the acid-dissociable, dissolution-inhibiting groups to dissociate, causing the entire component (A) to change to an alkali-soluble state from an alkali-insoluble state.

There are no particular restrictions on the acid dissociable, dissolution inhibiting groups, provided they are acid dissociable, dissolution inhibiting groups selected appropriately from those proposed in a hydroxystyrene-based resin and a (meth)acrylate-based resin used in a chemically amplified photoresist composition for KrF or ArF. The term "(meth) acrylate" means either or both of acrylate and methacrylate. Specific examples include a tertiary alkyl group, a tertiary alkyloxycarbonyl group, an alkoxycarbonylalkyl group, an alkoxyalkyl group, and a cyclic ether group.

Specific examples of the tertiary alkyl group are tertiary alkyl groups including chain tertiary alkyl groups such as a tert-butyl group and a tert-amyl group; and aliphatic polycyclic groups such as a 2-methyl-2-adamantyl group and a 2-ethyl-2-adamantyl group.

In the specification and claims, the term "alkyl group", unless stated otherwise, means a monovalent saturated hydrocarbon group. The term "aliphatic" is a relative concept used in relation to the term "aromatic", and defines a group or compound or the like that contains no aromaticity. The term "aliphatic cyclic group" describes a monocyclic group or polycyclic group that contains no aromaticity, and may be either saturated or unsaturated, but is preferably saturated.

The tertiary alkyl group in the tertiary alkyloxycarbonyl group includes the same groups as those described above, and specific examples include a tert-butyloxycarbonyl group and a tert-amyloxycarbonyl group.

Specific examples of the cyclic ether group include a tetrahydropyranyl group and a tetrahydrofuranyl group.

In the present invention, it is preferred to include at least one kind of an acid dissociable, dissolution inhibiting group selected from the group consisting of an alkoxycarbonylalkyl group represented by general formula (p1) shown below and an alkoxyalkyl group represented by general formula (p2) shown below, in terms of achieving excellent effects for the present invention:

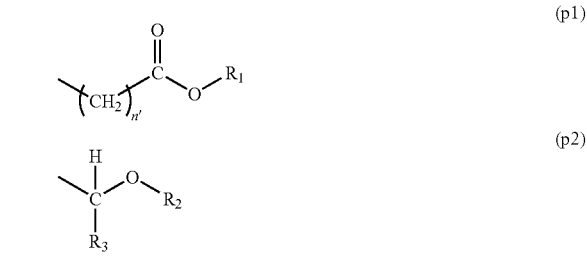

(wherein $R_1$ and $R_2$ each represents, independently, a straight-chain, branched-chain, or a cyclic alkyl group, and may include a hetero atom in the structure; $R_3$ represents a hydrogen atom or a lower alkyl group; and n' represents an integer from 1 to 3).

In general formula (p1), n' represents an integer from 1 to 3, and preferably 1.

$R_1$ represents a straight-chain, branched-chain, or a cyclic alkyl group, and may include a hetero atom in the structure. Namely, the alkyl group as $R_1$ is an alkyl group in which either a portion of, or all of, the hydrogen atoms may be substituted with a group containing a hetero atom (including the case of a hetero atom itself) and a portion of the carbon atoms may be substituted with hetero atoms.

Examples of the hetero atom include an oxygen atom, a sulfur atom, a nitrogen atom, and a fluorine atom.

The group containing a hetero atom may be a hetero atom itself, or a group composed of a hetero atom, a carbon atom and/or a hydrogen atom, for example, an alkoxy group.

Examples of the alkyl group in which either a portion of, or all of, hydrogen atoms are substituted with a group containing a hetero atom, include a fluorinated lower alkyl group of 1 to 5 carbon atoms in which either a portion of, or all of, the hydrogen atoms are substituted with a fluorine atom, a group in which two hydrogen atoms bonded to the same carbon atom are substituted with one oxygen atom (i.e., a group containing a carbonyl group (C=O)), and a group in which two hydrogen atoms bonded to the same carbon atom are substituted with one sulfur atom (i.e., a group. containing a thiocarbonyl (C=S)).

Examples of the group in which a portion of the carbon atoms of the alkyl group are substituted with a group containing a hetero atom include a group in which carbon atoms are substituted with nitrogen atoms (for example, a group in which —$CH_2$— is substituted with —NH— in a branched-chain or cyclic alkyl group containing —$CH_2$— in the structure) and a group in which carbon atoms are substituted with oxygen atoms (for example, a group in which —$CH_2$— is substituted with —O— in a branched-chain or cyclic alkyl group containing —$CH_2$— in the structure).

The straight-chain alkyl group as $R_1$ is preferably an alkyl group of 1 to 5 carbon atoms, and specific examples include a methyl group, an ethyl group, an n-propyl group, an n-butyl group, an isobutyl group, and an n-pentyl group, of which a methyl group or an ethyl group is preferred.

The branched-chain alkyl group as $R_1$ is preferably an alkyl group of 4 to 10 carbon atoms and more preferably 4 to 8 carbon atoms, and specific examples include an isobutyl group, a tert-butyl group, an isopentyl group, a neopentyl group, and a tert-pentyl group, of which a tert-butyl group is preferred.

The cyclic alkyl group as $R_1$ is preferably an alkyl group of 3 to 10 carbon atoms, preferably 4 to 14 carbon atoms, and most preferably 5 to 12 carbon atoms.

The structure of a basic ring (basic ring substituent in which substituents have been removed) in the cyclic alkyl group may be either a monocyclic structure or a polycyclic structure, and a polycyclic structure is particularly preferred, in terms of achieving excellent effects for the present invention. The basic ring may be a hydrocarbon ring composed of carbons and hydrogens, or a heterocycle in which a portion of the carbon atoms that form the hydrocarbon ring are substituted with hetero atoms. In the present invention, the basic ring is particularly preferably a hydrocarbon ring. Examples of the hydrocarbon ring include monocycloalkanes, bicycloalkanes, tricycloalkanes, and tetracycloalkanes. Specific examples include monocycloalkanes such as cyclopentane and cyclohexane; and polycycloalkanes such as adamantane, norbornane, isobornane, tricyclodecane, and tetracyclododecane. Of these hydrocarbon rings, adamantane, norbornane, tricyclodecane, and tetracyclododecane are preferred, and adamantane is particularly preferred.

These basic rings may include a substituent on the ring.

Examples of the substituent include a lower alkyl group, a fluorine atom, a fluorinated lower alkyl group, and an oxygen atom (=O). Examples of the lower alkyl group include straight-chain or branched-chain alkyl groups of 1 to 5 carbon atoms, such as a methyl group and an ethyl group. When the basic ring has a substituent, the number of the substituents is preferably from 1 to 3, and more preferably 1. Herein, the expression "includes a substituent" means that hydrogen atoms bonded to carbon atoms that form a basic ring are substituted with a substituent.

The cyclic alkyl group as $R_1$ includes a group in which one hydrogen atom has been removed from these basic rings. In $R_1$, the carbon atom bonded to an adjacent oxygen atom of $R_1$ is preferably one of the carbon atoms that form the above basic ring is preferred, and the carbon atom bonded to an adjacent oxygen atom of $R_1$ is particularly preferably a tertiary carbon atom bonded with a substituent such as a lower alkyl group, in terms of achieving excellent effects for the present invention.

Examples of acid dissociable, dissolution inhibiting groups containing a cyclic alkyl group as $R_1$ include groups represented by the formulas shown below:

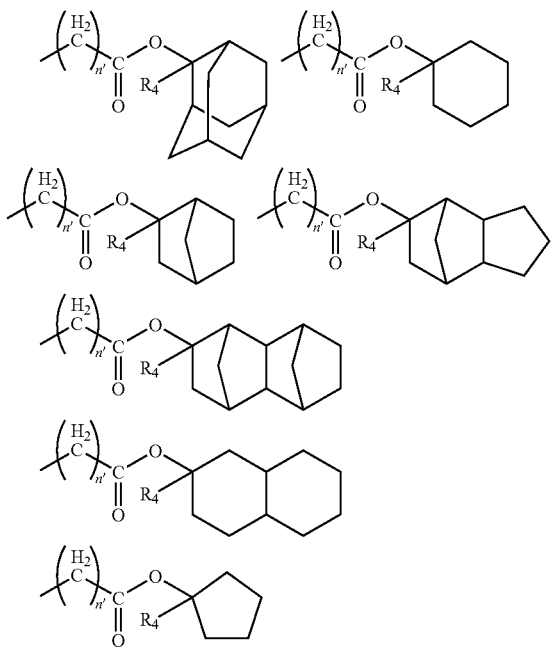

(wherein $R_4$ represents a lower alkyl group, and n' is as defined above).

Of these groups, those represented by the general formula shown below are preferred:

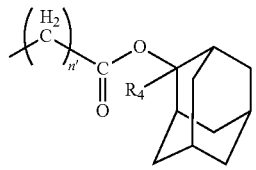

(wherein $R_4$ represents a lower alkyl group, and n' is as defined above).

The lower alkyl group as $R_4$ is an alkyl group of 1 to 5 carbon atoms, and specific examples include lower straight-chain or branched-chain alkyl groups such as a methyl group, an ethyl group, a propyl group, an isopropyl group, an n-butyl group, an isobutyl group, a tert-butyl group, a pentyl group, an isopentyl group, and a neopentyl group. $R_4$ is preferably a methyl group or an ethyl group, and more preferably a methyl group, in terms of factors such as industrial availability.

In the formula (p2), $R_2$ includes the same groups as those of $R_1$. Of these groups, $R_2$ is preferably a straight-chain alkyl group or a cyclic alkyl group.

$R_3$ is a hydrogen atom or a lower alkyl group. The lower alkyl group as $R_3$ is an alkyl group of 1 to 5 carbon atoms, and specific examples include lower straight-chain or branched-chain alkyl groups such as a methyl group, an ethyl group, a propyl group, an isopropyl group, an n-butyl group, an isobutyl group, a tert-butyl group, a pentyl group, an isopentyl group, and a neopentyl group. $R_3$ is preferably a hydrogen atom or a methyl group, and more preferably a hydrogen atom, in terms of factors such as industrial availability.

Examples of the group represented by formula (p2) in which $R_2$ is a straight-chain alkyl group include a 1-ethoxyethyl group, a 1-ethoxymethyl group, a 1-methoxyethyl group, a 1-methoxymethyl group, a 1-methoxypropyl group, a 1-ethoxypropyl group, a 1-n-butoxyethyl group, a 1-pentafluoroethoxyethyl group, a 1-trifluoromethoxyethyl group, and a 1-trifluoromethoxymethyl group.

Examples of the group represented by formula (p2) in which $R_2$ is a cyclic alkyl group include groups represented by the formulas shown below:

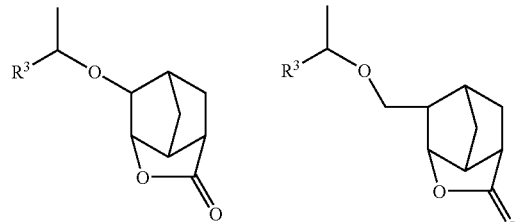
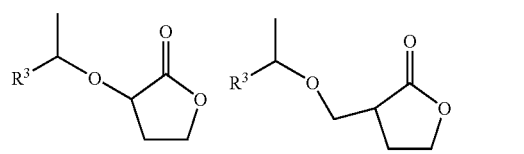
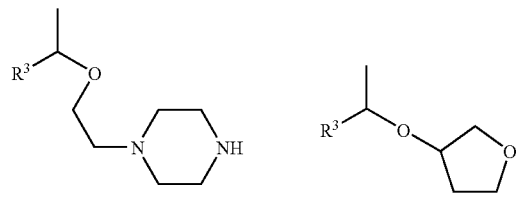
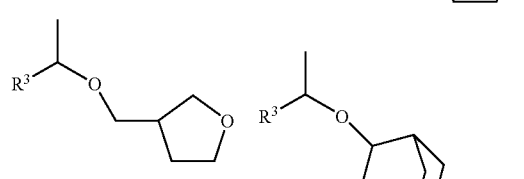
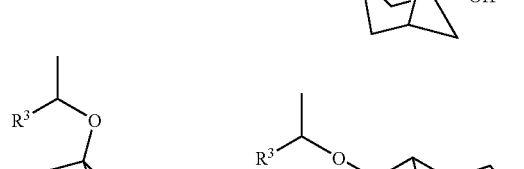
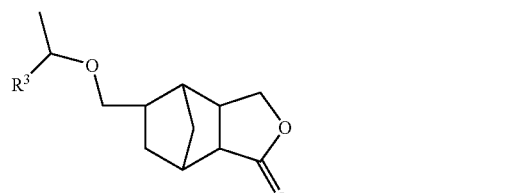
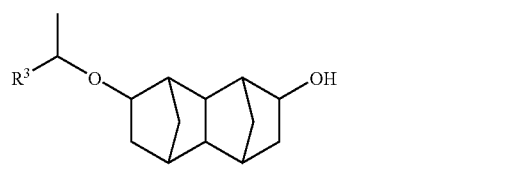

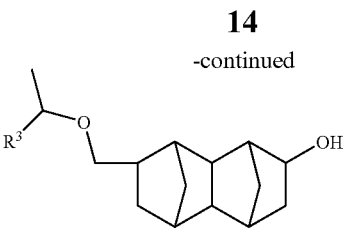
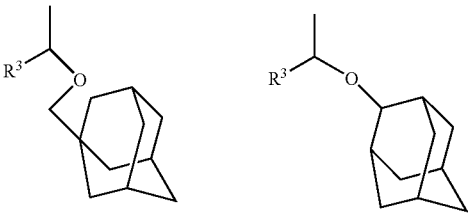
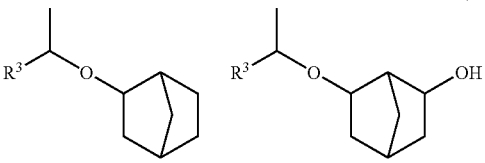
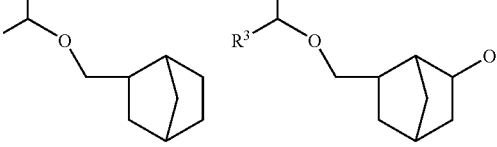
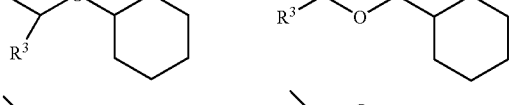
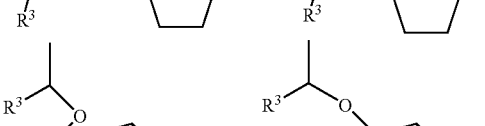
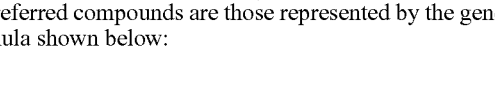
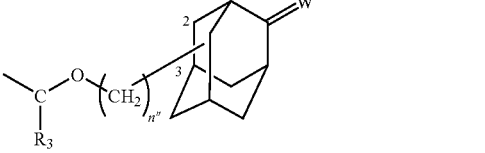

(wherein $R^3$ is as defined above).

Preferred compounds are those represented by the general formula shown below:

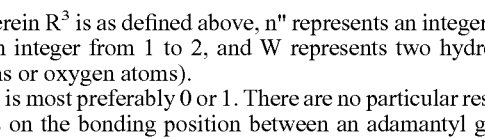

(wherein $R^3$ is as defined above, n" represents an integer of 0 or an integer from 1 to 2, and W represents two hydrogen atoms or oxygen atoms).

n" is most preferably 0 or 1. There are no particular restrictions on the bonding position between an adamantyl group and —C(R_3)—O—(CH_2)_{n"}—, and it is preferred to bond to either position 1 or position 2 of the adamantyl group.

The compound (A1) can be prepared, for example, by substituting either a portion of, or all of, the hydrogen atoms of the phenolic hydroxyl group of the polyhydric phenol compound (a) with acid dissociable, dissolution inhibiting groups using a known method.

The polyhydric phenol compound (a) can be synthesized, for example, by dissolving a bissalicylaldehyde derivative and a phenol derivative (in an amount of about 4 equivalents based on the bissalicylaldehyde derivative) in an organic solvent and reacting under acidic conditions.

In the positive resist composition of this aspect, it is necessary that the compound (A1) exhibits a standard deviation ($s_n$) of the number of protective groups per molecule of less than 1.

Herein, the term "the number of protective groups" means the number of phenolic hydroxyl groups protected with acid dissociable, dissolution inhibiting groups in the compound (A1). As described above, the compound (A1) can be prepared by substituting hydrogen atoms of the phenolic hydroxyl group of the polyhydric phenol compound (a) with acid dissociable, dissolution inhibiting groups. In that case, multiple molecules, each containing a different number of protective groups, are produced and the number of protective groups is usually determined as the average. The proportion of each "multiple molecules, each containing a different number of protective groups" in this compound (A1) can be measured by a means such as liquid chromatography.

The "standard deviation ($s_n$) of the number of protective groups per molecule" is determined by paying attention to the unevenness of the number of protective groups at a molecular level in this compound (A1), and a resist pattern having reduced roughness can be formed by adjusting the standard deviation $s_n$ to a value of less than 1. Namely, in the compound (A1) in which the phenolic hydroxyl groups of a low molecular weight polyhydric phenol compound have been protected with acid dissociable, dissolution inhibiting groups so as to adjust the standard deviation ($s_n$) of the number of protective groups per molecule to a value of less than 1, the number of acid dissociable, dissolution inhibiting groups per molecule scarcely varies, and properties (for example, alkali solubility) do not vary or vary very little with the molecule. As the number of the phenolic hydroxyl group of the polyhydric phenol compound (a) becomes closer, the number of the phenolic hydroxyl group of the compound (A1) becomes closer. As described above, when a compound having small dispersion degree is used as the polyhydric phenol compound (a), the properties become more uniform. Therefore, the resist film obtained by using a resist containing such a compound has more uniform film properties, for example, distribution of various components in the film, alkali solubility, and thermal properties (Tg (glass transition point)), and thus the compound (A1) is a low molecular weight compound and the roughness reducing effect is exerted.

Taking account of the roughness reducing effect, the smaller the standard deviation $s_n$ of the number of protective groups per molecule, the better. For example, the standard deviation $s_n$ is more preferably 0.5 or less, still more preferably 0.3 or less, and most preferably 0.

Specifically, the standard deviation $s_n$ of the number of protective groups can be calculated by the following procedure.

First, a compound obtained by using a polyhydric phenol compound containing x phenolic hydroxyl groups is used as the compound (A1) and it is assumed that the compound (A1) is composed of 1,000 molecules.

With respect to the compound (A1), the average (Xave (p)) of the protection ratio (%) is calculated by NMR, and then the average (Xave (n)) of the number of protective groups is calculated from the Xave (p) and the number (x) of phenolic hydroxyl groups of the polyhydric phenol compound (a) used.

Then, the compound (A1) is subjected to reverse phase liquid chromatography, and the number of protective groups (Xi (n)) per molecule and the number n (n=proportion of peak area of reverse phase liquid chromatography×1,000) of molecules (i protector (I=0 to x)) having the number of protective groups per molecule of Xi (n) existing in 1,000 molecules are determined from the proportion of the peak area.

By inserting these values into the formula (1-n) of standard deviation shown below, the standard deviation ($s_n$) of the number of protective groups per molecule is calculated.

$$\sigma_n = \sqrt{\frac{\sum_{i=0}^{n}(Xave(n) - Xi(n))^2}{1000}} \tag{1-n}$$

The standard deviation $s_n$ Of the number of protective groups per molecule can be adjusted to a value of less than 1 by protecting phenolic hydroxyl groups of the polyhydric phenol compound (a) with acid dissociable, dissolution inhibiting groups, and purifying through column chromatography, thereby recovering molecules in which the number of protective groups is within a specific range (or removing molecules in which the number of protective groups is not within a specific range).

Namely, since when the number of protective groups is different, the molecular weight, polarity, and alkali solubility vary with the molecule, it is possible to separate molecules, each having a different number of protective groups, by column chromatography using a silica gel column. Therefore, in the case of recovering a fraction containing molecules in which the number of protective groups is within a specific range, the standard deviation $s_n$ can be decreased by narrowing the range of the number of protective groups of the molecules to be recovered. For example, with respect to a compound obtained by one kind of a polyhydric phenol compound (a), the standard deviation $s_n$ of the number of protective groups per molecule can be adjusted to 0 by recovering a fraction containing only molecules, which contain a specific number of protective groups, through column chromatography.

The standard deviation $s_n$ of the number of protective groups per molecule may be adjusted to a desired value by the following procedure. For example, the compound (A1) is preliminarily purified and the standard deviation $s_n$ Of the number of protective groups per molecule of the resulting purified compound is determined using NMR, liquid chromatography, or the standard deviation of formula (1-n), as described above, and the conditions and the specific range of column chromatography are set so as to adjust the value to a desired value (less than 1).

There are no particular restrictions on the average of the number of protective groups of the compound (A1), and the average may be appropriately decided taking account of the structure of the polyhydric phenol compound (a) to be used and a protection ratio described hereinafter.

The average of the number of protective groups can be determined by the following procedure. For example, an average of the protection ratio described hereinafter is measured by NMR (nuclear magnetic resonance spectrum) such as proton-NMR or carbon NMR and the average is determined from the value and the structure of the polyhydric phenol compound (a).

The average of the number of protective groups can be adjusted by adjusting the range of the number of protective groups to be recovered in the case of adjusting the standard deviation ($s_n$) of the number of protective groups per molecule.

In this aspect, more preferably, the compound (A1) exhibits a standard deviation ($s_p$) of the protection ratio (mol %) per molecule of less than 16.7.

Herein, the term "protection ratio" means the proportion (mol %) of the number of protective groups based on the total of the number of phenolic hydroxyl groups protected with acid dissociable, dissolution inhibiting groups (i.e., the number of protective groups) and the number of non-protected phenolic hydroxyl groups in the compound (A1). Namely, the number of protective groups is the value that is not influenced by the structure of the polyhydric phenol compound (a), whereas, the protection ratio is the value influenced by the number of phenolic hydroxyl groups and the number of protective groups.

The compound (A1) contains, similar to the number of protective groups, multiple molecules, each having a different protection ratio, and the protection ratio is usually determined as the average. The proportion of each "multiple molecules, each having a different protection ratio" in the compound (A1) can be determined by measuring the proportion of multiple molecules, each having a different number of protective groups, through means such as reverse phase liquid chromatography, and calculating the protection ratio from the number of the phenolic hydroxyl group per molecule.

The expression "standard deviation $s_p$ of the protection ratio per molecule" is determined by paying attention to unevenness of the protection ratio at a molecular level in this compound (A1), and a resist pattern having reduced roughness can be formed by adjusting the standard deviation $s_p$ to the value of less than 16.7. Namely, in the compound (A1) in which the phenolic hydroxyl groups of a low molecular weight polyhydric phenol compound have been protected with acid dissociable, dissolution inhibiting groups so as to adjust the standard deviation $s_p$ of the protection ratio per molecule to the value of less than 16.7, the ratio of acid dissociable, dissolution inhibiting groups per molecule to phenolic hydroxyl groups scarcely varies, and properties do not vary or vary very little with the molecule. Therefore, in the case of a resist film obtained by using a resist containing the compound (A1), similarly to the case where the standard deviation $s_n$ of the number of protective groups was adjusted to a value of less than 1, film properties (for example, alkali solubility) become uniform. As described above, when a compound having small dispersion degree is used as the polyhydric phenol compound (a), the properties become more uniform. Therefore, the resist film obtained by using a resist containing such a compound has more uniform film properties, for example, distribution of various components in the film, alkali solubility, and thermal properties (Tg (glass transition point)), and thus the compound (A1) is a low molecular weight compound and the roughness reducing effect is exerted.

Taking account of the roughness reducing effect, the smaller the standard deviation $s_p$ of the protection ratio per molecule, the better. For example, the standard deviation is more preferably 8 or less, still more preferably 4 or less, and most preferably 0.

Specifically, the standard deviation $s_p$ of the protection ratio can be calculated by the following procedure.

First, a compound obtained by using a polyhydric phenol compound containing x phenolic hydroxyl groups is used as the compound (A1) and it is assumed that the compound (A1) is composed of 1,000 molecules.

With respect to the compound (A1), the average (Xave (p)) of the protection ratio (%) is calculated by NMR and, in the same manner as described above, the average (Xave (n)) of the number of protective groups, the number of protective groups (Xi (n)) per molecule and the number n of molecules (i protector (I=0 to x)) having the number of protective groups per molecule of Xi (n) existing in 1,000 molecules are determined.

Then, the protection ratio (protection ratio (%) per molecule; Xi (p)) of each molecule (for example, when the number of phenolic hydroxyl groups of the polyhydric phenol compound (a) is 6, the protection ratio is 0% in the case of no protection, 16.7% in the case of one protective group, 33.3% in the case of two protective groups . . . ) is calculated from the number of protective groups per molecule Xi (n) and the number (x) of phenolic hydroxyl groups of the polyhydric phenol compound (a) used.

By inserting these values into the formula (1-p) of standard deviation shown below, the standard deviation ($s_p$) of the protection ratio per molecule is calculated.

$$\sigma_p = \sqrt{\frac{\sum_{i=0}^{n}(Xave(p) - Xi(p))^2}{1000}} \quad (1\text{-}p)$$

The standard deviation $s_p$ of the protection ratio per molecule can be adjusted to a value of less than 16.7 by protecting phenolic hydroxyl groups of the polyhydric phenol compound (a) with acid dissociable, dissolution inhibiting groups, and purifying through column chromatography, thereby recovering molecules in which the protection ratio is within a specific range (or removing molecules in which the protection ratio is not within a specific range).

Namely, since when the protection ratio is different, the molecular weight, polarity, and alkali solubility vary with the molecule as described above, it is possible to separate molecules, each having a different protection ratio, by column chromatography using a silica gel column.

As described above, the protection ratio is the proportion of the number of protective groups based on the total of the number of protected phenolic hydroxyl groups and non-protected phenolic hydroxyl groups. Therefore, the protection ratio in molecules containing protective groups can be calculated from the number of phenolic hydroxyl groups of the polyhydric phenol compound (a).

Therefore, the standard deviation $s_p$ of the protection ratio per molecule can be adjusted within a specific range by recovering a fraction containing molecules in which the number of protective groups is within a specific range. In that case, the standard deviation $s_p$ can be decreased by narrowing the range of the protection ratio of the molecules to be recovered. For example, with respect to a compound obtained by one kind of the polyhydric phenol compound (a), the standard deviation $s_p$ of the protection ratio per molecule can be adjusted to 0 by recovering a fraction containing only molecules, which contain a specific number of protective groups, through column chromatography.

The standard deviation $s_p$ of the protection ratio per molecule may be adjusted to a desired value by the following procedure. For example, the compound (A1) is preliminarily purified and the standard deviation $s_p$ of the protection ratio per molecule of the resulting purified compound is determined using NMR, liquid chromatography, or the standard deviation of formula (1-p), as described above, and the conditions and the specific range of column chromatography are set so as to adjust the value to a desired value (less than 16.7).

The average of the protection ratio of the compound (A1) can be appropriately decided taking account of the structure and the number of phenolic hydroxyl groups of the polyhydric phenol compound (a), and desired various lithographic characteristics. For example, the average is preferably from 5 to 50 mol %, more preferably from 7 to 45 mol %, and still more preferably from 15 to 45 mol %, taking account of an improvement in resolution, in addition to the roughness reducing effect.

As described above, the average of the protection ratio can be measured, for example, by NMR.

The compound (A1) may be used alone, or a combination of two or more different compounds may be used.

The proportion of the compound (A1) in the component (A) is preferably more than 40% by mass, more preferably more than 50% by mass, still more preferably more than 80% by mass, and most preferably 100% by mass.

The proportion of the compound (A1) in the component (A) can be measured by a means such as reverse phase liquid chromatography.

The component (A) may include an optional resin component (hereinafter referred sometimes to as component (A2)), which has conventionally been proposed as a base material component of a chemically amplified photoresist layer, provided the inclusion of this optional resin component does not impair the effects of the present invention.

The component (A2) includes, for example, those proposed as a base resin of conventional KrF and ArF chemically amplified positive resist compositions, and can be appropriately selected according to the kind of the exposure light source used at the time of resist pattern formation.

The content of the component (A) in the positive resist composition of the present invention may be adjusted according to the thickness of the resist film to be formed.

<Component (B)>

There are no particular restrictions on the component (B) and it is possible to use those which have conventionally been proposed as an acid generator for a chemically amplified resist. As the acid generator, there are known various acid generators, for example, onium salt-based acid generators such as an iodonium salt and a sulfonium salt, oxime sulfonate-based acid generators, diazomethane-based acid generators such as bisalkyl or bisarylsulfonyldiazomethanes and poly(bissulfonyl)diazomethanes, nitrobenzylsulfonate-based acid generators, iminosulfonate-based acid generators, and disulfone-based acid generators.

Examples of the onium salt-based acid generators include compounds represented by general formulas (b-1) and (b-2):

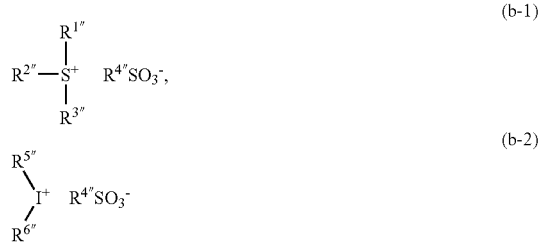

(wherein $R^{1'''}$ to $R^{3'''}$, and $R^{5'''}$ and $R^{6'''}$ each represents, independently, an aryl group or an alkyl group; and $R^{4'''}$ represents a straight-chain, branched-chain, or cyclic alkyl group or fluorinated alkyl group; provided that at least one of $R^{1'''}$ to $R^{3'''}$ represents an aryl group, and at least one of $R^{5'''}$ and $R^{6'''}$ represents an aryl group.)

In the formula (b-1), $R^{1'''}$ to $R^{3'''}$ each represents, independently, an aryl group or an alkyl group. Of the groups $R^{1'''}$ to $R^{3'''}$, at least one group represents an aryl group. Compounds in which at least two of $R^{1'''}$ to $R^{3'''}$ represent aryl groups are preferred, and compounds in which all of $R^{1'''}$ to $R^{3'''}$ are aryl groups are the most preferred.

There are no particular restrictions on the aryl groups of $R^{1'''}$ to $R^{3'''}$, and suitable examples include aryl groups of 6 to 20 carbon atoms, in which either a portion of, or all of, the hydrogen atoms of these aryl groups may be substituted with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, an ethyl group, a propyl group, an n-butyl group or a tert-butyl group is the most preferred.

Alkoxy groups that may be used for substitution of the hydrogen atoms of the above aryl groups are preferably alkoxy groups of 1 to 5 carbon atoms, and a methoxy group or an ethoxy group is the most preferred.

Halogen atoms that may be used for substitution of the hydrogen atoms of the above aryl groups are preferably fluorine atoms.

There are no particular restrictions on the alkyl groups of $R^{1'''}$ to $R^{3'''}$, and suitable examples include straight-chain, branched-chain, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, although in terms of achieving excellent resolution and enabling low-cost synthesis, a methyl group is the most preferred.

Of the above possibilities, compounds in which $R^{1'''}$ to $R^{3'''}$ are all phenyl groups are the most preferred.

The group $R^{4'''}$ represents a straight-chain, branched-chain, or cyclic alkyl group or fluorinated alkyl group.

As the straight-chain alkyl group, groups of 1 to 10 carbon atoms are preferred, groups of 1 to 8 carbon atoms are more preferred, and groups of 1 to 4 carbon atoms are the most preferred.

Suitable cyclic alkyl groups include the same groups as those listed above in relation to the group $R^{1'''}$, and cyclic groups of 4 to 15 carbon atoms are preferred, groups of 4 to 10 carbon atoms are more preferred, and groups of 6 to 10 carbon atoms are the most preferred.

As the above fluorinated alkyl group, groups of 1 to 10 carbon atoms are preferred, groups of 1 to 8 carbon atoms are more preferred, and groups of 1 to 4 carbon atoms are the most preferred. Furthermore, the fluorination ratio of the fluorinated alkyl group (the proportion of fluorine atoms in the alkyl group) is preferably within a range from 10 to 100%, and more preferably from 50 to 100%, and groups in which all of the hydrogen atoms have been substituted with fluorine atoms yield the strongest acids, and are consequently the most preferred.

The group $R^{4'''}$ is most preferably a straight-chain or cyclic alkyl group, or a fluorinated alkyl group.

In the formula (b-2), $R^{5''}$ to $R^{6''}$ each represents, independently, an aryl group or an alkyl group. At least one of $R^{5''}$ and $R^{6''}$ represents an aryl group. Compounds in which all of $R^{5''}$ and $R^{6''}$ are aryl groups are the most preferred. Examples of the aryl groups of the groups $R^{5''}$ and $R^{6''}$ include the same aryl groups as those described above for the groups $R^{1''}$ to $R^{3''}$.

Examples of the alkyl groups of the groups $R^{5''}$ and $R^{6''}$ include the same alkyl groups as those described above for the groups $R^{1''}$ and $R^{3''}$.

Of the above possibilities, compounds in which $R^{5''}$ and $R^{6''}$ are all phenyl groups are the most preferred.

Examples of the group $R^{4''}$ in the formula (b-2) include the same as those described above for the group $R^{4''}$ in formula (b-1).

Specific examples of the onium salt-based acid generators include diphenyliodonium trifluoromethane sulfonate or nonafluorobutane sulfonate, bis(4-tert-butylphenyl)iodonium trifluoromethane sulfonate or nonafluorobutane sulfonate, triphenylsulfonium trifluoromethane sulfonate, heptafluoropropane sulfonate or nonafluorobutane sulfonate, tri (4-methylphenyl)sulfonium trifluoromethane sulfonate, heptafluoropropane sulfonate or nonafluorobutane sulfonate, dimethyl(4-hydroxynaphthyl)sulfonium trifluoromethane sulfonate, heptafluoropropane sulfonate or nonafluorobutane sulfonate, monophenyldimethyl sulfonium trifluoromethane sulfonate, heptafluoropropane sulfonate or nonafluorobutane sulfonate, diphenylmonomethylsulfonium trifluoromethane sulfonate, heptafluoropropane sulfonate or nonafluorobutane sulfonate, (4-methylphenyl)diphenylsulfonium trifluoromethane sulfonate, heptafluoropropane sulfonate or nonafluorobutane sulfonate, (4-methoxyphenyl)diphenylsulfonium trifluoromethane sulfonate, heptafluoropropane sulfonate or nonafluorobutane sulfonate, tri(4-tert-butyl)phenylsulfonium trifluoromethane sulfonate, heptafluoropropane sulfonate or nonafluorobutane sulfonate, and diphenyl (1-(4-methoxy)naphthyl)sulfonium trifluoromethane sulfonate, heptafluoropropane sulfonate or nonafluorobutane sulfonate. Furthermore, onium salts in which the anion portion of the above onium salts has been substituted with a methanesulfonate, n-propanesulfonate, n-butanesulfonate, or n-octanesulfonate can also be used.

Furthermore, onium salts in which the anion portion of the above onium salts has been substituted with an anion portion represented by general formula (b-3) or (b-4) shown below in general formula (b-1) or (b-2) (the cation portion is the same as in general formula (b-1) or (b-2)).

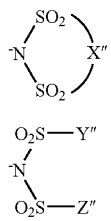

(b-3)

(b-4)

(wherein X" represents an alkylene group of 2 to 6 carbon atoms in which at least one hydrogen atom has been substituted with a fluorine atom; and Y" and Z" each represents, independently, an alkyl group of 1 to 10 carbon atoms in which at least one hydrogen atom has been substituted with a fluorine atom).

The group X" is a straight-chain or branched-chain alkylene group in which at least one hydrogen atom has been substituted with a fluorine atom, and the number of carbon atoms in the alkylene group is typically within a range from 2 to 6, preferably from 3 to 5, and most preferably 3.

Y" and Z" each represents, independently, a straight-chain or branched-chain alkyl group in which at least one hydrogen atom has been substituted with a fluorine atom, and the number of carbon atoms in the alkyl group is typically within a range from 1 to 10, preferably from 1 to 7, and most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene groups or alkyl groups, namely the fluorination ratio, is preferably within a range from 70 to 100%, and more preferably from 90 to 100%, and perfluoroalkylene groups or perfluoroalkyl groups in which all of the hydrogen atoms have been substituted with fluorine atoms are the most preferable.

In the present invention, the oxime sulfonate-based acid generator describes a compound that contains at least one structure represented by general formula (B-1) shown below, wherein the compound generates an acid upon irradiation. These types of oxime sulfonate-based acid generators are widely used within chemically amplified resist compositions, and any of these compounds may be selected and used.

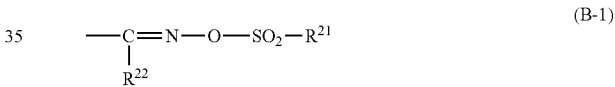

(B-1)

(in formula (B-1), $R^{21}$ and $R^{22}$ each represents, independently, an organic group)

In the present invention, an organic group is a group which includes a carbon atom and may include an atom other than a carbon atom (for example, a hydrogen atom, an oxygen atom, a nitrogen atom, a sulfur atom, or a halogen atom (fluorine atom, chlorine atom, or the like)).

The organic group represented by $R^{21}$ is preferably a straight-chain, branched-chain, or cyclic alkyl group or aryl group. These alkyl group and aryl group may include a substituent. There are no particular restrictions on the substituent and examples include a fluorine atom, and a straight-chain, branched-chain, or cyclic alkyl group of 1 to 6 carbon atoms. Herein, the expression "includes a substituent" means that either a portion of, or all of, the hydrogen atoms of the alkyl group or the aryl group are substituted with a substituent.

The alkyl group is preferably an alkyl group of 1 to 20 carbon atoms, more preferably from 1 to 10 carbon atoms, still more preferably from 1 to 8 carbon atoms, particularly preferably from 1 to 6 carbon atoms, and most preferably from 1 to 4 carbon atoms. The alkyl group is preferably an alkyl group that has been partially or completely halogenated (hereinafter referred sometimes to as a halogenated alkyl group). The expression "alkyl group that has been partially halogenated" refers to an alkyl group in which a portion of the hydrogen atoms are substituted with halogen atoms, whereas the expression "alkyl group that has been completely halogenated" refers to an alkyl group in which all of the hydrogen atoms are substituted with halogen atoms. Examples of the halogen atom include a fluorine atom, a chlorine atom, a bromine atom, and an iodine atom, of which a fluorine atom is particularly preferable. Namely, the halogenated alkyl group is preferably a fluorinated alkyl group.

The aryl group is preferably an aryl group of 4 to 20 carbon atoms, more preferably 4 to 10 carbon atoms, and most preferably 6 to 10 carbon atoms. The aryl group is particularly preferably an aryl group that has been partially or completely halogenated. The expression "aryl group that has been partially halogenated" refers to an aryl group in which a portion of the hydrogen atoms are substituted with halogen atoms, whereas the expression "aryl group that has been completely halogenated" refers to an aryl group in which all of the hydrogen atoms are substituted with halogen atoms.

As $R^{21}$, an alkyl group of 1 to 4 carbon atoms which includes no substituent, or a fluorinated alkyl group of 1 to 4 carbon atoms is particularly preferable.

As the organic group represented by $R^{22}$, a straight-chain, branched-chain, or cyclic alkyl group, aryl group or cyano group is preferred. Examples of the alkyl group or aryl group represented by $R^{22}$ include the same alkyl group or aryl group exemplified above in relation to the group $R^{21}$.

As $R^{22}$, a cyano group, an alkyl group of 1 to 8 carbon atoms which includes no substituent, or a fluorinated alkyl group of 1 to 8 carbon atoms is particularly preferable.

More preferred oxime sulfonate-based acid generators include compounds represented by general formula (B-2) or (B-3) shown below:

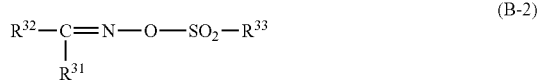
(B-2)

(in formula (B-2), $R^{31}$ is a cyano group, or an alkyl group or a halogenated alkyl group which includes no substituent. $R^{32}$ is an aryl group. $R^{33}$ is an alkyl group or a halogenated alkyl group which includes no substituent), and

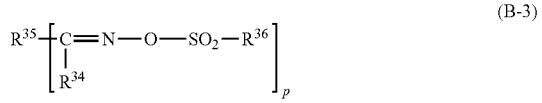
(B-3)

(in formula (B-3), $R^{34}$ is a cyano group, or an alkyl group or a halogenated alkyl group which includes no substituent, $R^{35}$ is a di- or trivalent aromatic hydrocarbon group, $R^{36}$ is an alkyl group or a halogenated alkyl group which includes no substituent, and p is either 2 or 3]

In general formula (B-2) shown above, the alkyl group or halogenated alkyl group including no substituent group represented by $R^{31}$ is preferably a group of 1 to 10 carbon atoms, more preferably 1 to 8 carbon atoms, and most preferably 1 to 6 carbon atoms.

$R^{31}$ is preferably a halogenated alkyl group, and more preferably a fluorinated alkyl group.

In the fluorinated alkyl group represented by $R^{31}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable.

Examples of the aryl group represented by $R^{32}$ include groups in which one hydrogen atom has been removed from the ring of the aromatic hydrocarbon, such as a phenyl group, a biphenyl group, a fluorenyl group, a naphthyl group, an anthracyl group, and a phenanthryl group; and heteroaryl groups in which a portion of the carbon atoms that form the ring of these groups has been substituted with a hetero atom such as an oxygen atom, a sulfur atom, or a nitrogen atom. Of these groups, a fluorenyl group is preferred.

The aryl group represented by $R^{32}$ may include a substituent such as an alkyl group of 1 to 10 carbon atoms, a halogenated alkyl group, or an alkoxy group. The alkyl group or the halogenated alkyl group in the substituent is preferably a group of 1 to 8 carbon atoms, and more preferably 1 to 4 carbon atoms. The halogenated alkyl group is preferably a fluorinated alkyl group.

The alkyl group or halogenated alkyl group represented by $R^{33}$ which includes no substituent is preferably a group of 1 to 10 carbon atoms, more preferably 1 to 8 carbon atoms, and most preferably 1 to 6 carbon atoms.

$R^{33}$ is preferably a halogenated alkyl group, or an alkyl group that has been partially or completely fluorinated.

In the fluorinated alkyl group represented by $R^{33}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable because they increase the strength of the acid that is generated. Completely fluorinated alkyl groups in which 100% of the hydrogen atoms have been substituted with fluorine atoms are the most preferable.

In general formula (B-3) shown above, examples of the alkyl group or halogenated alkyl group represented by $R^{34}$ which includes no substituent include the same alkyl group or halogenated alkyl group represented by $R^{31}$ which includes no substituent.

Examples of the di- or trivalent aromatic hydrocarbon group represented by $R^{35}$ include groups in which one or two hydrogen atoms have been removed furthermore from the aryl group represented by $R^{32}$.

Examples of the alkyl group or halogenated alkyl group represented by $R^{36}$ which includes no substituent include the same alkyl group or halogenated alkyl group represented by $R^{33}$ which includes no substituent.

p is preferably 2.

Specific examples of the oxime sulfonate-based acid generators include a-(p-toluenesulfonyloxyimino)-benzylcyanide, a-(p-chlorobenzenesulfonyloxyimino)-benzylcyanide, a-(4-nitrobenzenesulfonyloxyimino)-benzylcyanide, a-(4-nitro-2-trifluoromethylbenzenesulfonyloxyimino)-benzylcyanide, a-(benzenesulfonyloxyimino)-4-chlorobenzylcyanide, a-(benzenesulfonyloxyimino)-2,4-dichlorobenzyl cyanide, a-(benzenesulfonyloxyimino)-2,6-dichlorobenzyl cyanide, a-(benzenesulfonyloxyimino)-4-methoxybenzyl cyanide, a-(2-chlorobenzenesulfonyloxyimino)-4-methoxybenzyl cyanide, a-(benzenesulfonyloxyimino)-thien-2-yl acetonitrile, a-(4-dodecylbenzenesulfonyloxyimino)-benzyl cyanide, a-[(p-toluenesulfonyloxyimino)-4-methoxyphenyl] acetonitrile, a-[(dodecylbenzenesulfonyloxyimino)-4-methoxyphenyl]acetonitrile, a-(tosyloxyimino)-4-thienyl cyanide, a-(methylsulfonyloxyimino)-1-cyclopentenyl acetonitrile, a-(methylsulfonyloxyimino)-1-cyclohexenyl acetonitrile, a-(methylsulfonyloxyimino)-1-cycloheptenyl acetonitrile, a-(methylsulfonyloxyimino)-1-cyclooctenyl acetonitrile, a-(trifluoromethylsulfonyloxyimino)-1-cyclopentenyl acetonitrile, a-(trifluoromethylsulfonyloxyimino)-cyclohexyl acetonitrile, a-(ethylsulfonyloxyimino)-ethyl acetonitrile, a-(propylsulfonyloxyimino)-propyl acetonitrile, a-(cyclohexylsulfonyloxyimino)-cyclopentyl acetonitrile, a-(cyclohexylsulfonyloxyimino)-cyclohexyl acetonitrile, a-(cyclohexylsulfonyloxyimino)-1-cyclopentenyl acetonitrile, a-(ethylsulfonyloxyimino)-1-cyclopentenyl acetonitrile, a-(isopropylsulfonyloxyimino)-1-cyclopentenyl acetonitrile, a-(n-butylsulfonyloxyimino)-1-cyclopentenyl acetonitrile, a-(ethylsulfonyloxyimino)-1-cyclohexenyl acetonitrile, a-(isopropylsulfonyloxyimino)-1-cyclohexenyl acetonitrile, a-(n-butylsulfonyloxyimino)-1-cyclohexenyl acetonitrile, a-(methylsulfonyloxyimino)-phenyl acetonitrile, a-(methylsulfonyloxyimino)-p-methoxyphenyl acetonitrile, a-(trifluoromethylsulfonyloxyimino)-phenyl acetonitrile, a-(trifluoromethylsulfonyloxyimino)-p-methoxyphenyl acetonitrile, a-(ethylsulfonyloxyimino)-p-methoxyphenyl acetonitrile, a-(propylsulfonyloxyimino)-p-methylphenyl acetonitrile, and a-(methylsulfonyloxyimino)-p-bromophenyl acetonitrile.

Further examples include the compounds represented by the chemical formulas shown below.

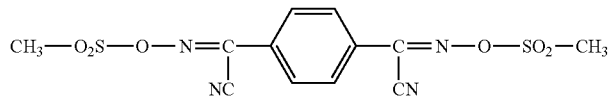

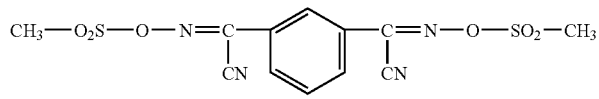

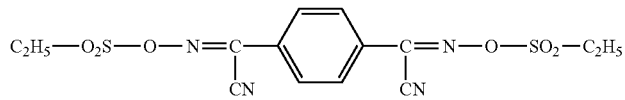

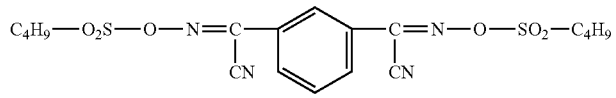

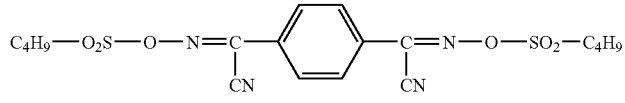

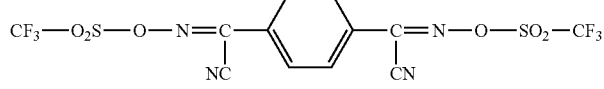

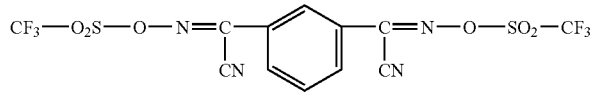

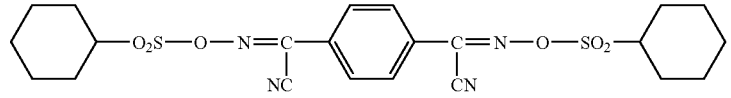

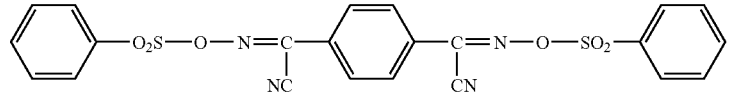

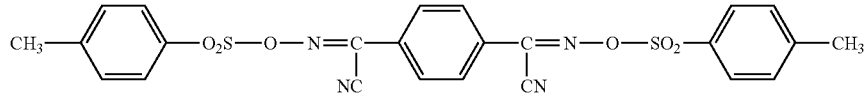

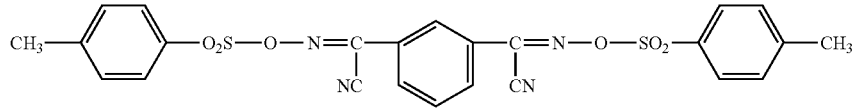

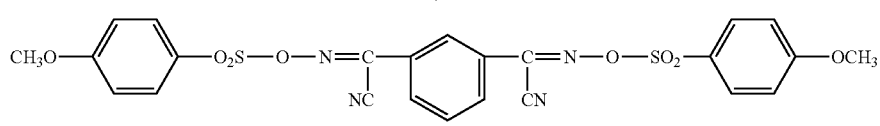

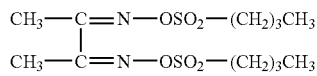

Of the compounds represented by the above general formulas (B-2) and (B-3), examples of preferred compounds include those shown below.
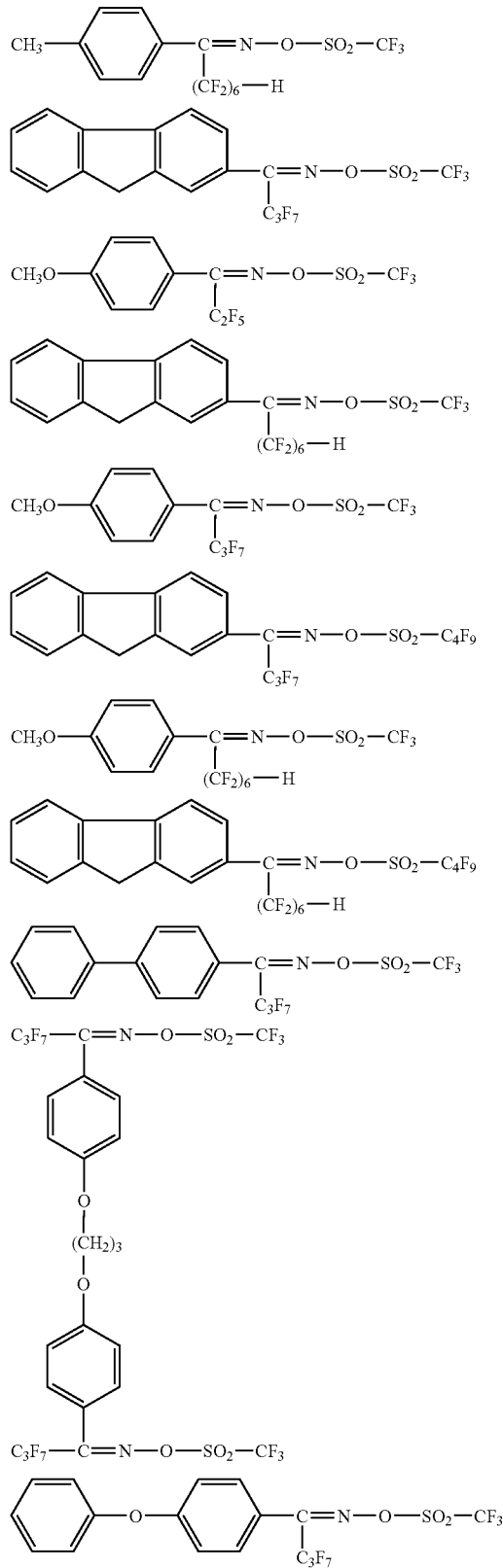
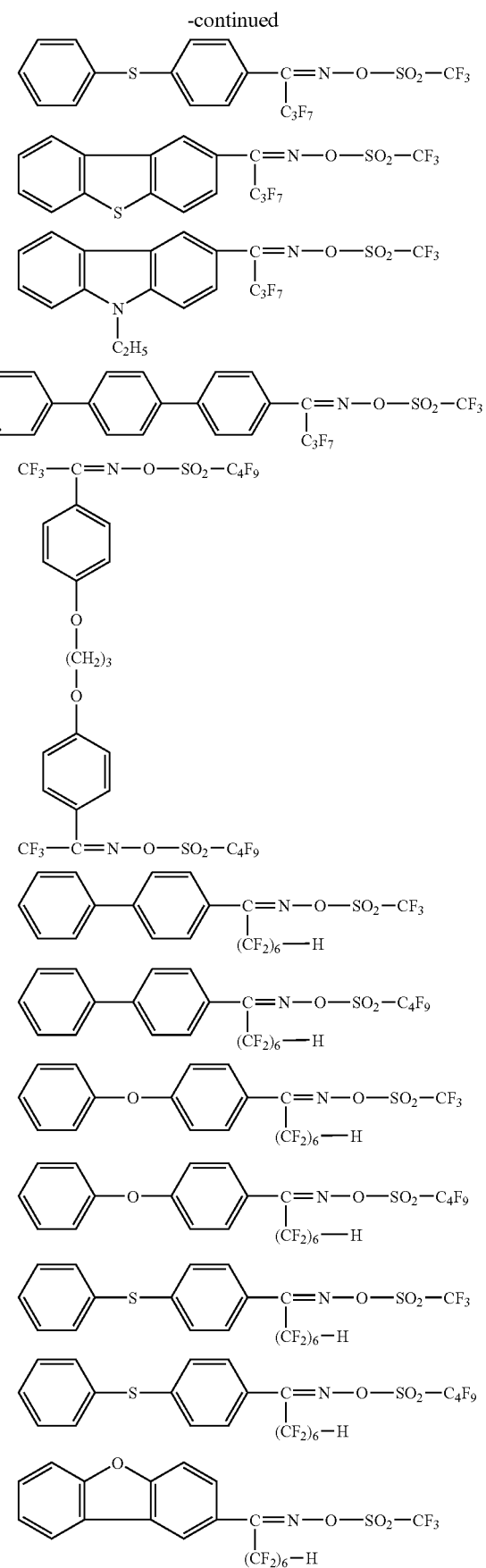

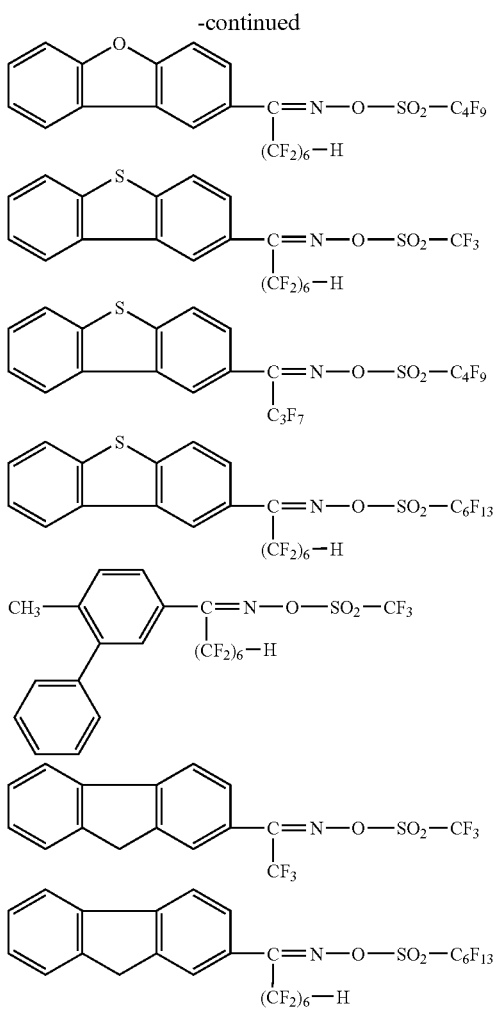

Of the compounds listed above, the three compounds shown below are preferred.

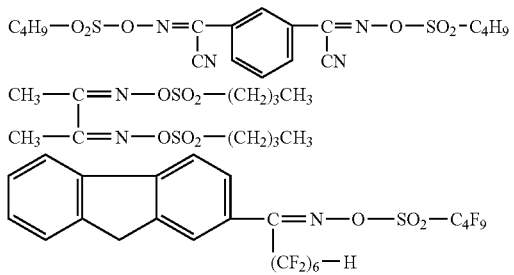

Of the diazomethane-based acid generators, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of poly(bissulfonyl)diazomethanes include those having structures shown below, such as 1,3-bis(phenylsulfonyl diazomethylsulfonyl)propane (in the case of A=3), 1,4-bis(phenylsulfonyl diazomethylsulfonyl)butane (in the case of A=4), 1,6-bis(phenylsulfonyl diazomethylsulfonyl)hexane (in the case of A=6), 1,10-bis(phenylsulfonyl diazomethylsulfonyl)decane (in the case of A=10), 1,2-bis(cyclohexylsulfonyl diazomethylsulfonyl)ethane (in the case of B=2), 1,3-bis(cyclohexylsulfonyl diazomethylsulfonyl)propane (in the case of B=3), 1,6-bis(cyclohexylsulfonyl diazomethylsulfonyl)hexane (in the case of B=6), and 1,10-bis(cyclohexylsulfonyl diazomethylsulfonyl)decane (in the case of B=10).

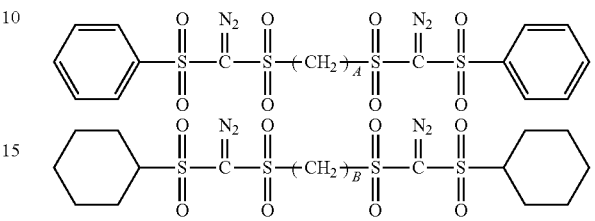

In the present invention, it is preferred to use, as the component (B), an onium salt containing fluorinated alkylsulfonic acid ions or alkylsulfonic acid ions as the anion.

The components (B) can be used either alone, or in combinations of two or more different components.

The content of the entire component (B) is from 0.5 to 30 parts by mass and preferably from 1 to 10 parts by mass, based on 100 parts by mass of the component (A). Ensuring that the content is within the above ranges enables sufficient carrying out of pattern formation. It is preferred because a uniform solution is obtained and storage stability is improved.

<Optional Components>

In a positive resist composition of the present invention, in order to improve the resist pattern shape and the post exposure stability (post exposure stability of the latent image formed by the pattern-wise exposure of the resist layer), it is possible to add, as an optional component, a nitrogen-containing organic compound (D) (hereinafter referred to as component (D)).

A multitude of these components (D) have already been proposed, and any of these known compounds may be used. Specific examples include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, or tri-n-octanolamine. Of these amines, secondary aliphatic amine or a tertiary lower aliphatic amine is preferred and trialkylamine of 5 to 10 carbon atoms is more preferred, and a tri-n-octylamine is most preferred.

These amines can be used either alone, or in combinations of two or more different amines.

The component (D) is usually used in an amount within a range from 0.01 to 5.0 parts by mass per 100 parts by mass of the component (A).

Furthermore, in order to prevent any deterioration in sensitivity caused by the addition of the above component (D), and improve the resist pattern shape and post exposure stability (post exposure stability of the latent image formed by the pattern-wise exposure of the resist layer), an organic carboxylic acid, or a phosphorus oxo acid or derivative thereof (E) (hereafter referred to as a component (E)) may also be added to the positive resist composition of the present invention as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in an amount within a range from 0.01 to 5.0 parts by weight per 100 parts by weight of the component (A).

Other miscible additives can also be added to the positive resist composition of the present invention according to need, and examples include additive resins for improving the properties of the resist film, surfactants for improving the coating properties, dissolution inhibitors, plasticizers, stabilizers, colorants, halation prevention agents, and dyes.

<Organic Solvent (S)>

The positive resist composition of the present invention can be prepared by dissolving the materials (the component (A) and the component (B), and various optional components) in an organic solvent (hereinafter referred sometimes to as "component (S)").

The organic solvent may be any solvent capable of dissolving the various components used to generate a uniform solution, and one or more solvents selected from known materials used as solvents for conventional chemically amplified resists can be used.

Specific examples of the solvent include lactones such as γ-butyrolactone;

ketones such as acetone, methyl ethyl ketone, cyclohexanone, methyl isoamyl ketone, and 2-heptanone;

polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate, and propylene glycol monomethyl ether acetate (PGMEA);

cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents prepared by mixing propylene glycol monomethyl ether acetate (PGMEA) with a polar solvent are preferred. Although the blend ratio (mass ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the mass ratio PGMEA:EL is preferably within a range from 1:9 to 9:1, and is even more preferably from 2:8 to 8:2.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the amount used of the organic solvent, although the amount should be set in accordance with the coating film thickness required, at a concentration that enables favorable application of the solution to a substrate or the like. Typically, the amount of the solvent is set so that the solid fraction concentration of the resist composition falls within a range from 2 to 20% by mass, and preferably from 5 to 15% by mass.

(Positive Resist Composition of Second Aspect)

The positive resist composition according to the second aspect of the present invention is the same as the positive resist composition of the first aspect, except for the following essential constituent that the compound (A1) exhibits a standard deviation ($s_p$) of the protection ratio (mol %) per molecule of less than 16.7 in the component (A). It is not necessary for the positive resist composition of the second aspect to include the following essential constituent that the compound (A1) exhibits a standard deviation ($s_n$) of the number of protective groups per molecule of less than 1.

When the standard deviation ($s_p$) of the protection ratio (mol %) per molecule is less than 16.7, a resist pattern having reduced roughness can be formed. The description for the standard deviation ($s_p$) of the protection ratio (mol %) per molecule is the same as in the first aspect.

(Third or Fourth Resist Pattern Forming Method)

The method for forming a resist pattern of the present invention includes the steps of forming a resist film on a substrate using the positive resist composition according to the first or second aspect; exposing the resist film; and developing the resist film, thereby forming a resist pattern.

More specifically, a resist pattern can be formed by the following resist pattern forming method. Namely, the above positive resist composition is first applied to a substrate such as a silicon wafer using a spin coater or the like, and post applied prebaking (PAB) is then conducted, thus forming a resist film. The resist film thus formed is selectively exposed by exposure through a mask pattern or by writing with direct irradiation with electron beam through no mask pattern using an exposure apparatus such as electron beam lithography system or EUV exposure apparatus, and then subjected to post exposure baking (PEB). After developing with an alkali developing solution, the developing solution on the substrate and the resist composition dissolved by the developing solution are washed away by a rinsing treatment, followed by drying to obtain a resist pattern.

These steps can be conducted using a known method. Preferably, the operation conditions are appropriately set according to the composition of the positive resist composition to be used and properties.

There are no particular restrictions on the exposure light source, and an ArF excimer laser, a KrF excimer laser, a $F_2$ excimer laser, or other radiation such as EUV (extreme ultraviolet), VUV (vacuum ultraviolet), EB (electron beam), X-ray or soft X-ray radiation can be used. The present invention is particularly effective for use with electron beams or EUV, particularly electron beams.

After the alkali development, a post exposure baking step may also be included. An organic or inorganic anti-reflective film may also be provided between the substrate and the applied layer of the resist composition.

As described above, according to the positive resist composition of the present invention, and the method for forming a resist pattern using the positive resist composition, a resist pattern having reduced roughness can be formed.

Also, according to the positive resist composition of the present invention, and the method for forming a resist pattern using the positive resist composition, a resist pattern with high resolution, for example, a pattern of minute dimensions of 120 nm or less can be formed.

EXAMPLES

Examples of the present invention will now be described, but the scope of the present invention is not limited to the following Examples.

Preparation Example 1

Preparation of Compound (A)-1

10 g of a polyhydric phenol compound (1) represented by formula (1) shown below (manufactured by Honshu Chemical Industry Co., Ltd.) was dissolved in 50 g of tetrahydrofuran (THF) and 1.12 g of 60 mass % sodium hydride (NaH) was added at 0° C., followed by stirring for 10 minutes, addition of 8.01 g of bromoacetic acid-2-methyl-2-adamantyl represented by formula (5) shown below and further stirring at room temperature (r.t.) for 5 hours. After the completion of the reaction, the reaction solution was purified by extraction with water/ethyl acetate and then the separated ethyl acetate solution was dried over sodium sulfate and concentrated under reduced pressure to obtain 15.0 g of a compound (A)-1 represented by formula (3) shown below:

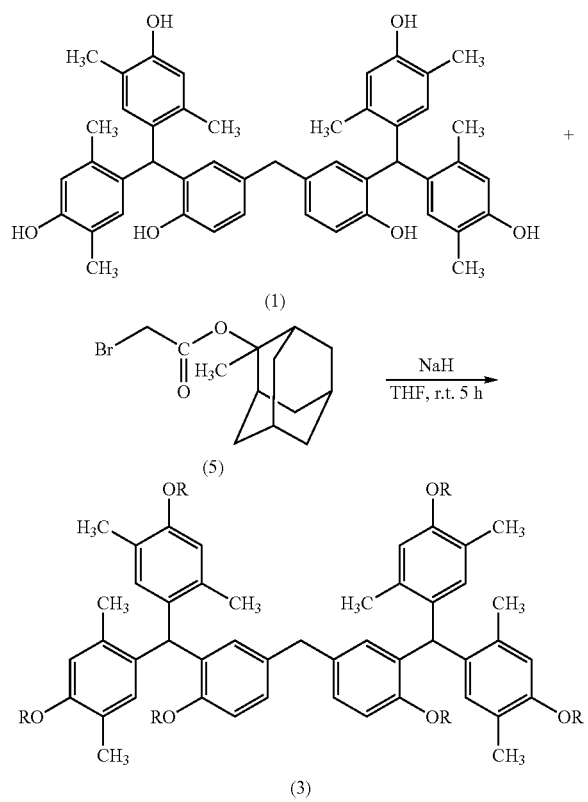

(in formula (3), R represents a hydrogen atom or a group represented by formula (5') shown below).

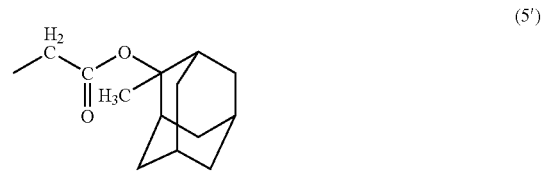

The compound (A)-1 was analyzed by $^1$H-NMR (hydrogen isotope nuclear magnetic resonance). The results are shown below. The results revealed that the average (Pave (p)) of the protection ratio (the proportion (mol %) in which R is a group represented by formula (5') shown below among R(s) in formula (3) shown above) per molecule of the compound (A)-1 is 30.2 mol %.

$^1$H-NMR (deuterated dimethyl sulfoxide (DMSO), internal standard: tetramethylsilane) d=8.75-9.08 (m, 3.76H), 6.33-6.80 (m, 14H), 5.60-5.96 (m, 2H), 4.48-4.75 (m, 3.62H), 3.41-3.63 (m, 2H), 1.35-2.25 (m, 58.43H)

Since the number of phenolic hydroxyl groups in the polyhydric phenol compound (1) is 6, the average (Pave (n)) of the number of protective groups per molecule of the compound (A)-1 was calculated from the average (Pave (p)) of the protection ratio and was found to be 1.812.

Determination of the compound (A)-1 was conducted by reverse phase liquid chromatography under the following conditions and the ratio of the i protector protected with i (i=0 to 6) phenolic hydroxyl groups existing in the polyhydric phenol compound (1) was determined from the proportion of the peak area. Assuming that the compound (A)-1 is composed of 1,000 molecules, the existing number $m_i$ of each protector was calculated from the existing ratio. The results are shown in Table 1.

<Conditions of Reverse Phase Liquid Chromatography>
Apparatus: SERIES1100 manufactured by Hewlett-Packard Company
Column: MG type manufactured by Shiseido Co., Ltd. (functional group: Particle size of C18: 3 μm, Inner diameter of column: 4.6 mm, Length of column: 75 mm)
Detection wavelength: 280 nm
Flow rate: 2.0 mL/min
Measuring temperature: 45° C.
Measuring time: 0 to 22 min
Amount of sample injected: 1.0 μL
Sample concentration (solid content): about 1.3% by mass (diluted with THF)
Eluant
    0 to 1 min: (1) Pure water/THF=60/40 (mass ratio)
    1 to 21 min: gradually changed from (1) to the following composition (2)
    21 to 22 min: (2) Pure water/THF=10/90 (mass ratio)

Using formulas (1-n) and (1-p), the standard deviation $s_n$ of the number of protective groups per molecule of the compound (A)-1, and the standard deviation $s_p$ of the protection ratio were calculated from these results.

The standard deviation $s_n$ of the number of protective groups was calculated as follows. First, with respect to each protector (the number of protective groups=0 to 4) each having a different number of protective groups, $(Pi(n)-Pave(n))^2$ was determined and each value was multiplied by the existing number $m_i$ of each protector. Then, each value of $(Pi(n)-Pave(n))^2 \times m_i$ for i=0 to 4 was added and the sum total was determined. The square root of the value obtained by dividing the sum total by 1,000 $((Pi(n)-Pave(n))^2 \times$ sum total of $m_i/1,000)$ is the standard deviation $s_n$ of the number of protective groups.

Also, standard deviation $s_p$ of the protection ratio was calculated by the following procedure. First, with respect to each i protector (i=0 to 4), $(Pi(p)-Pave (p))^2$ was determined and the value was multiplied by the existing number $m_i$ of each protector. Then, each value of $(Pi(p)-Pave (p))^2 \times m_i$ for i=0 to 4 was added and the sum total was determined. The square root of the value obtained by dividing the sum total by 1,000 $((Pi(p)-Pave (p))^2 \times \text{sum total of } m_i/1{,}000)$ is the standard deviation $(s_p)$ of the protection ratio (mol %) per molecule.

In these formulas, Pi (n) denotes the number of protective groups of each protector, Pave (n) denotes the average number of protective groups per molecule, Pi (p) denotes the protection ratio of each protector, and Pave (p) denotes the average of the protection ratio (%) per molecule.

form, the eluent was poured into the column and the resulting effluent was referred to as a fraction A. The fraction A was dried over sodium sulfate and then concentrated under reduced pressure to obtain a compound (A)-2.

Determination of the compound (A)-2 was conducted by reverse phase liquid chromatography in the same manner as in Preparation Example 1 and the number of each protector existing per 1,000 molecules was determined.

TABLE 1

|  | 0 protector | 1 protector | 2 protector | 3 protector | 4 protector |
|---|---|---|---|---|---|
| Number of protective groups (Pi (n)) of protector | 0 | 1 | 2 | 3 | 4 |
| Protection ratio (Pi (p) %) of protector | 0 | 16.7 | 33.3 | 50 | 66.7 |
| Existing number ($m_1$/1,000 molecules) | 114 | 309 | 354 | 186 | 37 |
| Pave (n) | | | 1.812 | | |
| Pave (p) % | | | 30.2 | | |
| $(Pi (n) - Pave (n))^2$ | 3.283 | 0.6593 | 0.03534 | 1.411 | 4.787 |
| $(Pi (n) - Pave (n))^2 \times m_1$ | 374.3 | 203.7 | 12.51 | 262.4 | 177.1 |
| $(Pi (n) - Pave (n))^2 \times$ sum total of $m_1/1{,}000$ | | | 1.03001 | | |
| Standard deviation $s_n$ of the number of protective groups per molecule | | | 1.01 | | |
| $(Pi (p) - Pave (p))^2$ | 912.04 | 182.25 | 9.61 | 392.04 | 1332.25 |
| $(Pi (p) - Pave (p))^2 \times m_1$ | 103972.6 | 56315.25 | 3401.94 | 72919.44 | 49293.25 |
| $(Pi (p) - Pave (p))^2 \times$ sum total of $m_1/1{,}000$ | | | 285.9024 | | |
| Standard deviation $s_p$ of protection ratio per molecule | | | 16.91 | | |

As shown in Table 1, the compound (A)-1 contained from a 0 protector to a 4 protector. Also, the standard deviation $s_n$ of the number of protective groups per molecule of the compound (A)-1 was 1.01, and the standard deviation $s_p$ of the protection ratio was 16.91.

Preparation Examples 2

Preparation of Compound (A)-2

The compound (A)-1 was purified once by silica gel column chromatography under the following conditions to obtain a compound (A)-2.

Purification conditions by silica gel column chromatography: Silica gel (Wakol Gel C100) was used and ethyl acetate was used as the eluent. Also, silica gel was used in an amount 20 times by mass larger than that of the substrate (compound (A)-1). The column tube used had a diameter of 9 cm.

After filling the column with a sample obtained by dissolving 10 g of the compound (A)-1 in a small amount of chloro- As a result of calculation from the existing number of each protector, the average Pave (n) of the number of protective groups per molecule of the compound (A)-2 was 2.178 and the average Pave (p) of the protection ratio was 36.3 mol %.

In the same manner as in Preparation Example 1, the standard deviation $s_n$ of the number of protective groups per molecule of the compound (A)-2 and the standard deviation $s_p$ of the protection ratio were calculated. The results are shown in Table 2.

TABLE 2

|  | 0 protector | 1 protector | 2 protector | 3 protector | 4 protector |
|---|---|---|---|---|---|
| Number of protective groups (Pi (n)) of protector | 0 | 1 | 2 | 3 | 4 |
| Protection ratio (Pi (p) %) of protector | 0 | 16.7 | 33.3 | 50 | 66.7 |
| Existing number ($m_1$/1,000 molecules) | 0 | 39 | 763 | 198 | 0 |
| Pave (n) | | | 2.178 | | |
| Pave (p) % | | | 36.3 | | |
| $(Pi (n) - Pave (n))^2$ | — | 1.388 | 0.03168 | 0.6757 | — |
| $(Pi (n) - Pave (n))^2 \times m_1$ | — | 54.13 | 24.17 | 133.8 | — |
| $(Pi (n) - Pave (n))^2 \times$ sum total of $m_1/1{,}000$ | | | 0.2121 | | |
| Standard deviation $s_n$ of the number of protective groups per molecule | | | 0.461 | | |
| $(Pi (p) - Pave (p))^2$ | — | 384.16 | 9 | 187.69 | — |
| $(Pi (p) - Pave (p))^2 \times m_1$ | — | 14982.24 | 6867 | 37162.62 | — |
| $(Pi (p) - Pave (p))^2 \times$ sum total of $m_1/1{,}000$ | | | 59.01186 | | |
| Standard deviation $s_p$ of protection ratio per molecule | | | 7.68 | | |

As shown in Table 2, the compound (A)-2 contains only 1 to 3 protectors. The standard deviation $s_n$ of the number of protective groups per molecule of the compound (A)-2 was 0.461 and the standard deviation $s_p$ of the protection ratio was 7.68.

Preparation Example 3

Preparation of Compound (A)-3

The fraction A was obtained in the same manner as in Preparation Example 2 and a second purification was conducted by silica gel column chromatography under the following conditions to obtain a compound (A)-3.

Second purification conditions by silica gel column chromatography: Silica gel (Wakol Gel C200) was used and a mixed solvent in a mixing ratio of chloroform and MEK (=9:1) was used as the eluent. Also, silica gel was used in an amount 20 times by mass larger than that of the substrate (compound (A)-2). The column tube used had a diameter of 9 cm.

Determination of the compound (A)-3 was conducted by reverse phase liquid chromatography in the same manner as in Preparation Example 1 and the number of each protector existing per 1,000 molecules was determined.

As a result, the compound (A)-3 contained only a 2 protector. Accordingly, the results revealed that the average Pave (n) of the number of protective groups per molecule of the compound (A)-2 was 2 and the average Pave (p) of the protection ratio was 33.3 mol %.

In the same manner as in Preparation Example 1, the standard deviation $s_n$ of the number of protective groups per molecule of the compound (A)-3 and the standard deviation $s_p$ of the protection ratio were calculated. The results are shown in Table 3.

Examples 1 and 2, and Comparative Example 1

The compounds (A)-1 to (A)-3 obtained in Preparation Examples 1 to 3 were mixed with the respective components shown in Table 4 below, and then dissolved to obtain positive resist composition solutions.

In Table 4, the numerical values within parentheses mean the amount (parts by mass). Also, the abbreviations in Table 4 mean as follows.
(B)-1: Triphenylsulfoniumnonafluoro-n-butanesulfonate
(D)-1: Tri-n-octylamine
(E)-1: Salicylic acid
(S)-1: PGMEA Then, each of the resulting positive resist composition solutions was uniformly applied on an 8 inch silicon substrate using a spinner, and a PAB treatment was then conducted under baking (PAB) conditions of 110° C. for 90 seconds, thus forming a resist film (thickness: 150 nm).

The resist film was subjected to writing (exposure) using an electron-beam direct writing system (HL-800D (VSB) (manufactured by Hitachi, Ltd.), acceleration voltage (70 kV)), and a PEB treatment was then conducted under baking (PEB) conditions of 100° C. for 90 seconds. Subsequently, development was conducted for 200 seconds using an aqueous 2.38 mass % solution (23° C.) of tetramethylammonium hydroxide (TMAH), followed by rinsing with pure water for 30 seconds. As a result, a 120 nm line-and-space (L/S) 1:1 pattern was formed

TABLE 3

|  | 0 protector | 1 protector | 2 protector | 3 protector | 4 protector |
| --- | --- | --- | --- | --- | --- |
| Number of protective groups (Pi (n)) of protector | 0 | 1 | 2 | 3 | 4 |
| Protection ratio (Pi (p) %) of protector | 0 | 15.7 | 33.3 | 50 | 66.7 |
| Existing number ($m_1$/1,000 molecules) | 0 | 0 | 1000 | 0 | 0 |
| Pave (n) |  |  | 2 |  |  |
| Pave (p) % |  |  | 33.3 |  |  |
| (Pi (n) − Pave (n))$^2$ | — | — | 0 | — | — |
| (Pi (n) − Pave (n))$^2$ × $m_1$ | — | — | 0 | — | — |
| (Pi (n) − Pave (n))$^2$ × sum total of $m_1$/1,000 |  |  | 0 |  |  |
| Standard deviation $s_n$ of the number of protective groups per molecule |  |  | 0 |  |  |
| (Pi (p) − Pave (p))$^2$ | — | — | 0 | — | — |
| (Pi (p) − Pave (p))$^2$ × $m_1$ | — | — | 0 | — | — |
| (Pi (p) − Pave (p))$^2$ × sum total of $m_1$/1,000 |  |  | 0 |  |  |
| Standard deviation $s_p$ of protection ratio per molecule |  |  | 0 |  |  |

As shown in Table 3, the compound (A)-3 contained only a 2 protector. Also, both the standard deviation $s_n$ of the number of protective groups per molecule of the compound (A)-3 and the standard deviation $s_p$ of a protection ratio were 0.

The resulting resist pattern was observed from the top using a scanning electron microscope manufactured by Hitachi, Ltd. (Measuring SEM, S-9220) and LER was evaluated according to the following criteria. The results are shown in Table 4.

TABLE 4

| | Component (A) | Component (B) | Component (D) | Component (E) | Organic solvent | LER |
|---|---|---|---|---|---|---|
| Example 1 | (A)-2 [100] | (B)-1 [12.6] | (D)-1 [0.38] | (E)-1 [0.15] | (S)-1 [1150] | A |
| Example 2 | (A)-3 [100] | (B)-1 [12.6] | (D)-1 [0.38] | (E)-1 [0.15] | (S)-1 [1150] | A |
| Comparative Example 1 | (A)-1 [100] | (B)-1 [12.6] | (D)-1 [0.38] | (E)-1 [0.15] | (S)-1 [1150] | B |

A: small line undulation
B: large line undulation

As is apparent from the above results, resist patterns obtained using the positive resist compositions of Examples 1 to 2 exhibited less line undulation and reduced ER.

In contrast, a resist pattern obtained using the positive resist composition of Comparative Example 1 exhibited large line undulation and inferior ER.

INDUSTRIAL APPLICABILITY

The present invention can provide a positive resist composition which enables formation of a resist pattern having reduced roughness, and a method for forming a resist pattern.

The invention claimed is:

1. A positive resist composition comprising a base material component (A) which exhibits increased alkali solubility under an action of an acid, and an acid generator component (B) which generates an acid upon exposure, wherein the base material component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups, wherein the average of the protection ratio of the compound (A1) is from 7 to 45 mol %, and the proportion of the compound (A1) in the component (A) is more than 80% by mass, the compound (A1) exhibits a standard deviation ($\sigma_n$) of the number of protective groups per molecule of less than 1, and the compound (A1) includes at least one acid dissociable, dissolution inhibiting group selected from the group consisting of an alkoxycarbonylalkyl group represented by general formula (p1) shown below and an alkoxyalkyl group represented by general formula (p2) shown below:

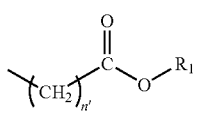

(p1)

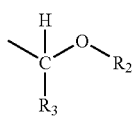

(p2)

(wherein $R_1$ represents a straight-chain, branched-chain, or a cyclic alkyl group, and may include a hetero atom in the structure; $R_2$ represents a cyclic alkyl group, and may include a hetero atom in the structure; and $R_3$ represents a hydrogen atom or a lower alkyl group; and n' represents an integer from 1 to 3).

2. A positive resist composition comprising a base material component (A) which exhibits increased alkali solubility under an action of an acid, and an acid generator component (B) which generates an acid upon exposure, wherein the base material component (A) contains a compound (A1) in which phenolic hydroxyl groups in a polyhydric phenol compound (a) containing two or more phenolic hydroxyl groups and having a molecular weight of 300 to 2,500 are protected with acid dissociable, dissolution inhibiting groups, wherein the average of the protection ratio of the compound (A1) is from 7 to 45 mol %, and the proportion of the compound (A1) in the component (A) is more than 80% by mass, the compound (A1) exhibits a standard deviation ($\sigma_p$) of a protection ratio (mol %) per molecule of less than 16.7, and the compound (A1) includes at least one acid dissociable, dissolution inhibiting group selected from the group consisting of an alkoxycarbonylalkyl group represented by general formula (p1) shown below and an alkoxyalkyl group represented by general formula (p2) shown below:

(p1)

(p2)

(wherein $R_1$ represents a straight-chain, branched-chain, or a cyclic alkyl group, and may include a hetero atom in the structure; $R_2$ represents a cyclic alkyl group, and may include a hetero atom in the structure; and $R_3$ represents a hydrogen atom or a lower alkyl group; and n' represents an integer from 1 to 3).

3. The positive resist composition according to claim 1, wherein the polyhydric phenol compound (a) is at least one kind selected from the group consisting of compounds represented by general formulas (I), (II), and (III) shown below, wherein R represents H, (p1) or (p2), and at least two of the R groups are independently (p1) or (p2)

(I)

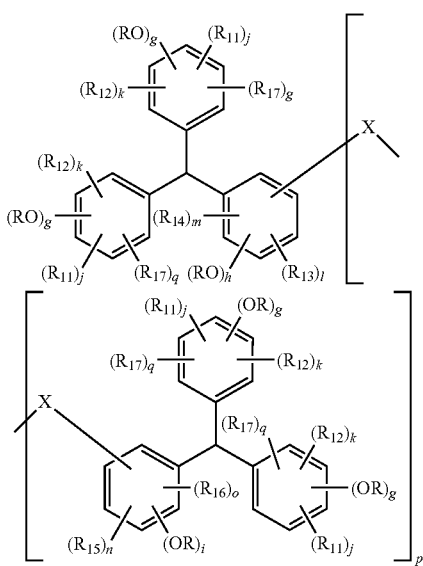

(in formula (I), $R_{11}$ to $R_{17}$ each represents, independently, an alkyl group of 1 to 10 carbon atoms or an aromatic hydrocarbon group, and may include a hetero atom in the structure; g and j each represents, independently, an integer of 1 or more, k and q represent an integer of 0 or 1 or more, and g+j+k+q represents 5 or less; h represents an integer of 1 or more, l and m each represents, independently, an integer of 0 or 1 or more, and h+l+m represents 4 or less; i represents an integer of 1 or more, n and o each represents, independently, an integer of 0 or 1 or more, and i+n+o represents 4 or less; p represents 0 or 1; and X represents a group represented by general formula (Ia) or (Ib) shown below):

(Ia)

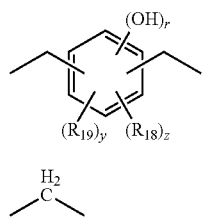

(Ib)

$\underset{C}{\overset{H_2}{\diagup\diagdown}}$ (in formula (Ia), $R_{18}$, $R_{19}$ each represents, independently, an alkyl group of 1 to 10 carbon atoms or an aromatic hydrocarbon group, and may include a hetero atom in the structure; and r, y, and z each represents, independently, an integer of 0 or 1 or more, and r+y+z represents 4 or less), (II)

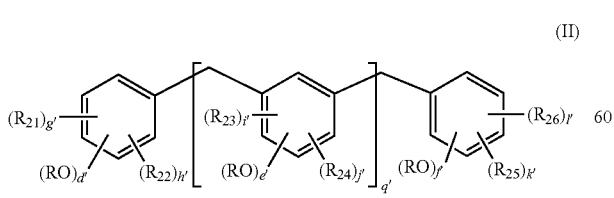

(in the formula (II), $R_{21}$ to $R_{26}$ each represents, independently, an alkyl group of 1 to 10 carbon atoms or an aromatic hydrocarbon group, and may include a hetero atom in the structure; d' and g'each represents, independently, an integer of 1 or more, h'represents an integer of 0 or 1 or more, and d'+g'+h' represents 5 or less; e' represents an integer of 1 or more, i' and j' each represents, independently, an integer of 0 or 1 or more, and e'+i'+j' represents 4 or less; f' and k' each represents, independently, an integer of 1 or more, l' represents an integer of 0 or 1 or more, and f'+k'+l' represents 5 or less; and q'represents an integer from 1 to 20), and (III)

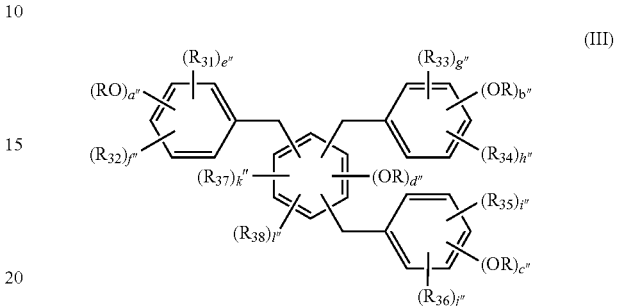

(in formula (III), $R_{31}$ to $R_{38}$ each represents, independently, an alkyl group of 1 to 10 carbon atoms or an aromatic hydrocarbon group, and may include a hetero atom in the structure; a" and e" each represents, independently, an integer of 1 or more, f" represents an integer of 0 or 1 or more, and a"+e"+f" represents 5 or less; b" and h" each represents, independently, an integer of 1 or more, g" represents an integer of 0 or 1 or more, and b"+h"+g" represents 5 or less; c" and i" each represents, independently, an integer of 1 or more, j" represents an integer of 0 or 1 or more, and c"+i"+j" represents 5 or less; and d" represents an integer of 1 or more, k", l" each represents, independently, an integer of 0 or 1 or more, and d"+k"+l" represents 3 or less).

4. The positive resist composition according to claim 2, wherein the polyhydric phenol compound (a) is at least one kind selected from the group consisting of compounds represented by general formulas (I), (II), and (III) shown below, wherein R represents H, (p1) or (p2), and at least two of the R groups are independently (p1) or (p2)

(I)

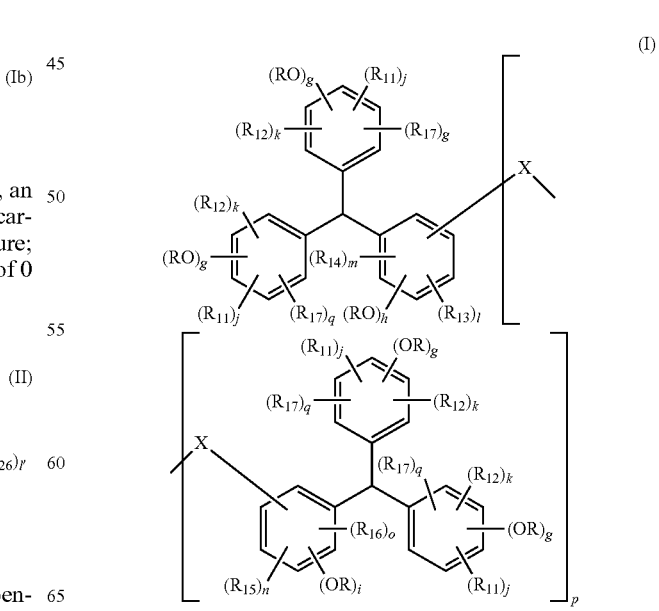

(in formula (I), $R_{11}$ to $R_{17}$ each represents, independently, an alkyl group of 1 to 10 carbon atoms or an aromatic hydrocarbon group, and may include a hetero atom in the structure; g and j each represents, independently, an integer of 1 or more, k and q represent an integer of 0 or 1 or more, and g+j+k+q represents 5 or less; h represents an integer of 1 or more, l and m each represents, independently, an integer of 0 or 1 or more, and h+l+m represents 4 or less; i represents an integer of 1 or more, n and o each represents, independently, an integer of 0 or 1 or more, and i+n+o represents 4 or less; p represents 0 or 1; and X represents a group represented by general formula (Ia) or (Ib) shown below):

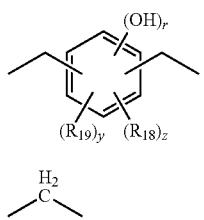

(in formula (Ia), $R_{18}$, $R_{19}$ each represents, independently, an alkyl group of 1 to 10 carbon atoms or an aromatic hydrocarbon group, and may include a hetero atom in the structure; and r, y, and z each represents, independently, an integer of 0 or 1 or more and r+y+z represents 4 or less),

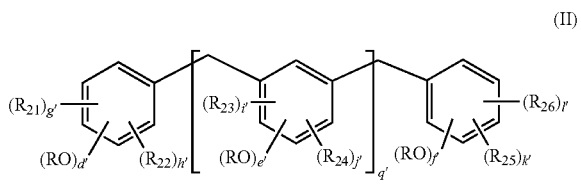

(in formula (II), $R_{21}$ to $R_{26}$ each represents, independently, an alkyl group of 1 to 10 carbon atoms or an aromatic hydrocarbon group, and may include a hetero atom in the structure; d' and g' each represents, independently, an integer of 1 or more, h' represents an integer of 0 or 1 or more and d'+g'+h' represents 5 or less; e' represents an integer of 1 or more, i' and j' each represents, independently, an integer of 0 or 1 or more, and e'+i'+j' represents 4 or less; f' and k' each represents, independently, an integer of 1 or more, l' represents an integer of 0 or 1 or more, and f'+k'+l' represents 5 or less; and q' represents an integer from 1 to 20), and

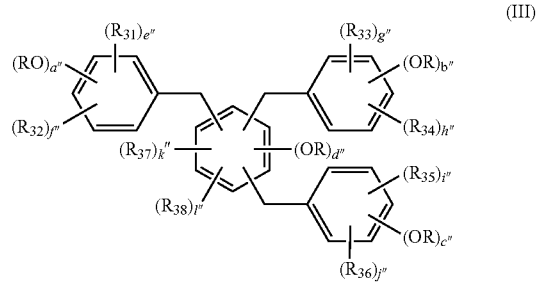

(in formula (III), $R_{31}$ to $R_{38}$ each represents, independently, an alkyl group of 1 to 10 carbon atoms or an aromatic hydrocarbon group, and may include a hetero atom in the structure; a" and e" each represents, independently, an integer of 1 or more, f" represents an integer of 0 or 1 or more, and a"+e"+f" represents 5 or less; b" and h" each represents, independently, an integer of 1 or more, g" represents an integer of 0 or 1 or more, and b"+h"+g" represents 5 or less; c" and i" each represents, independently, an integer of 1 or more, j" represents an integer of 0 or 1 or more, and c"+i"+j" represents 5 or less; and d" represents an integer of 1 or more, k" and l" each represents, independently, an integer of 0 or 1 or more, and d"+k"+l" represents 3 or less).

5. A method for forming a resist pattern comprising:
forming a resist film on a substrate using a positive resist composition according to claim 1, exposing the resist film, and developing the resist film to form a resist pattern.

6. A method for forming a resist pattern comprising:
forming a resist film on a substrate using a positive resist composition according to claim 2, exposing the resist film, and developing the resist film to form a resist pattern.

7. The positive resist composition according to claim 1, wherein the polyhydric phenol compound (a) is at least one kind selected from the group consisting of compounds represented by the following formulas (I-1), (I-2), (I-3), and (I-4), wherein R represents H, (p1) or (p2), and at least two of the R groups are independently (p1) or (p2)

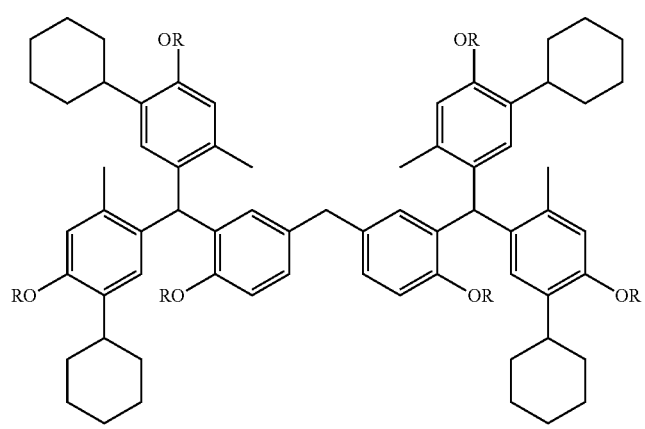

-continued
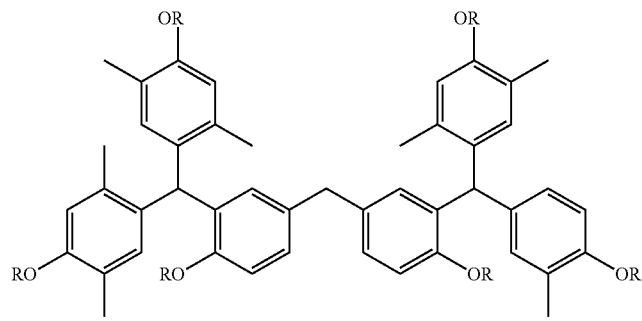
(I-2)
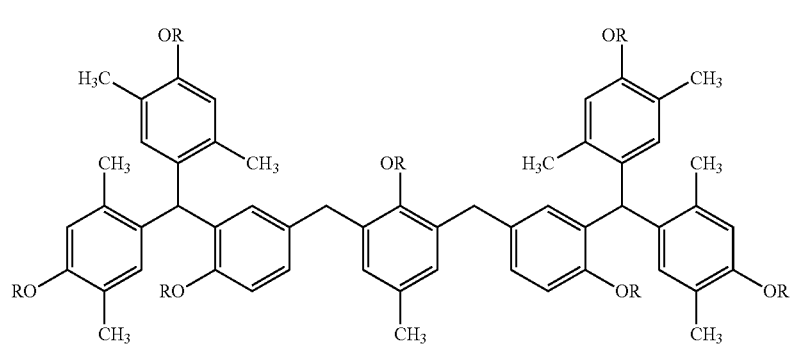
(I-3)
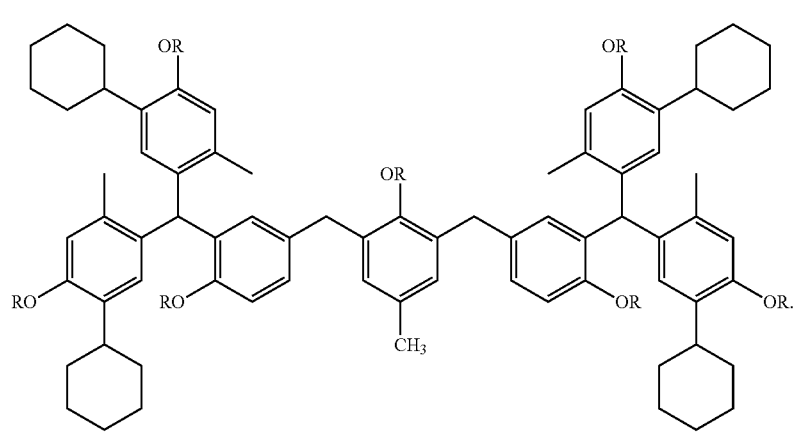
(I-4)

8. The positive resist composition according to claim 2, wherein the polyhydric phenol compound (a) is at least one kind selected from the group consisting of compounds represented by the following formulas (I-1), (I-2), (I-3), and (I-4), wherein R represents H, (p1) or (p2), and at least two of the R groups are independently (p1) or (p2)
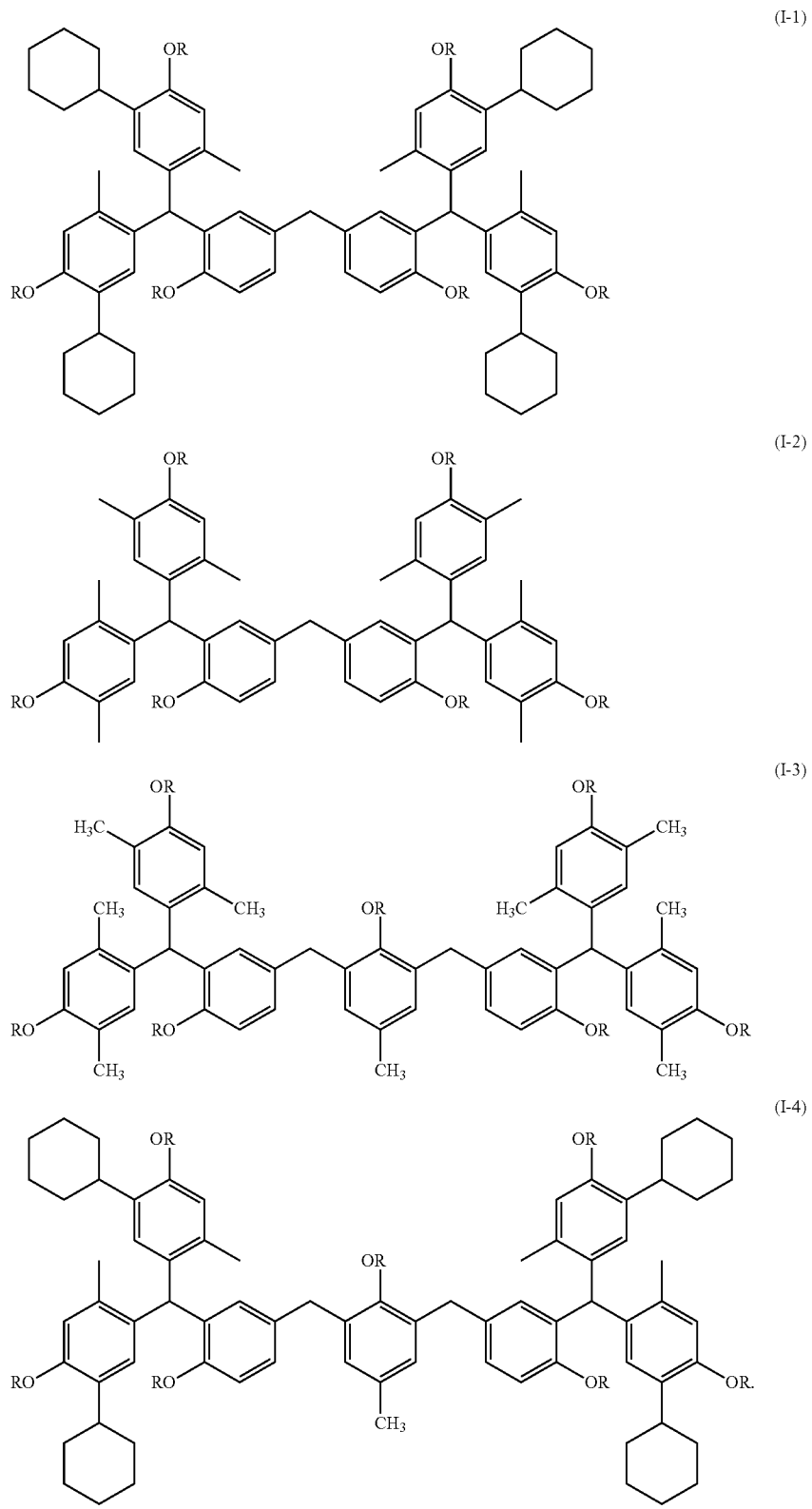

9. The positive resist composition according to claim 1, wherein the alkoxycarbonylalkyl group represented by general formula (p1) is at least one member selected from the group consisting of groups represented by the following formulas;

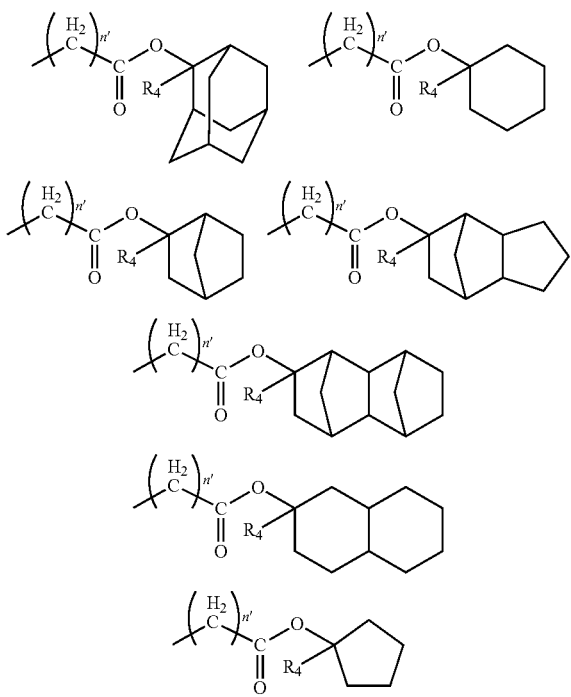

(wherein $R_4$ represents a lower alkyl group, and n' represents an integer from 1 to 3); and the alkoxyalkyl group represented by general formula (p2) is at least one member selected from the group consisting of groups represented by the following formulas:

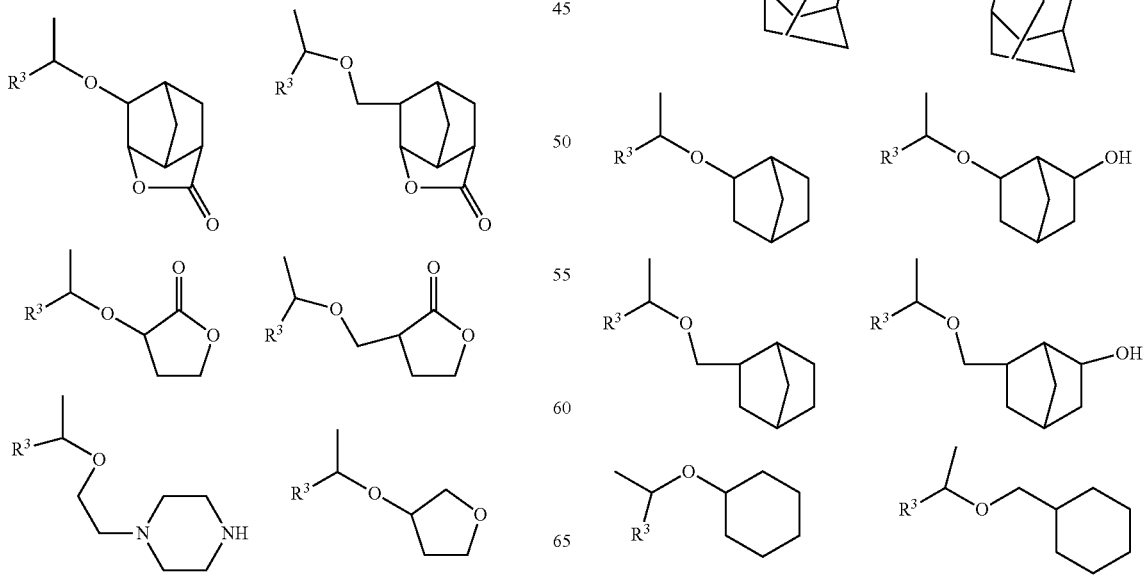

-continued

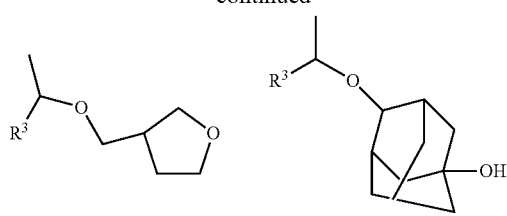
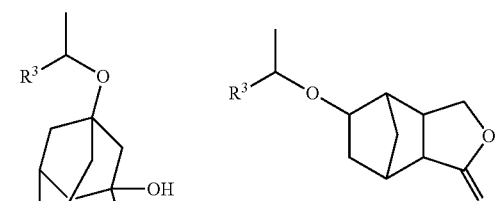
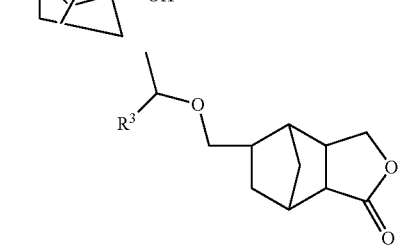
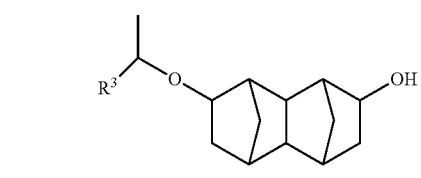
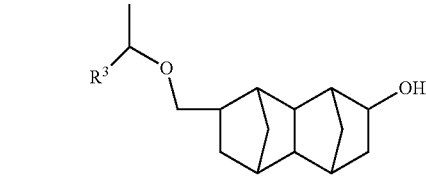
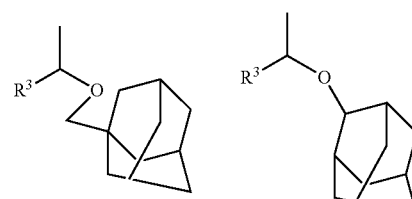
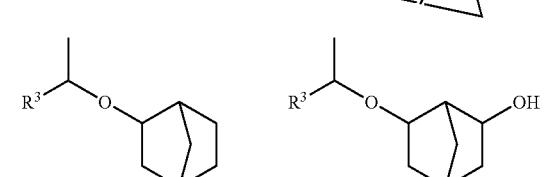
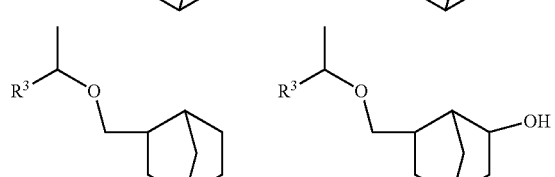
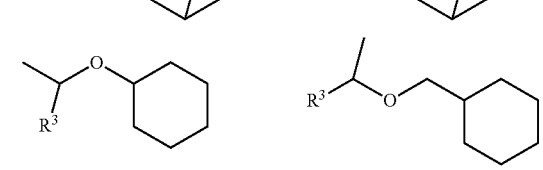

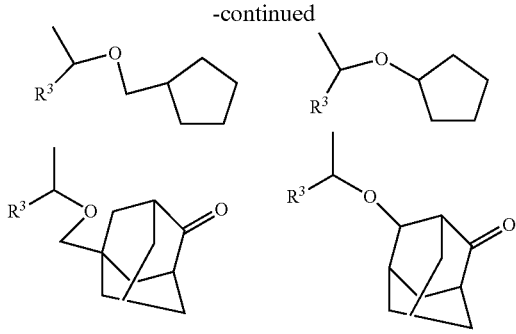

(wherein R₃ represents a hydrogen atom or a lower alkyl group).

10. The positive resist composition according to claim 2, wherein the alkoxycarbonylalkyl group represented by general formula (p1) is at least one member selected from the group consisting of groups represented by the following formulas;

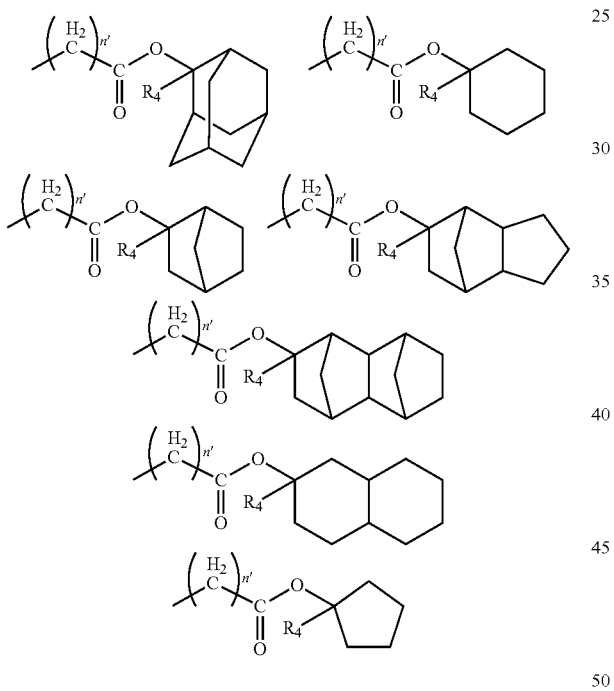

(wherein $R_4$ represents a lower alkyl group, and n' represents an integer from 1 to 3); and the alkoxyalkyl group represented by general formula (p2) is at least one kind selected from the group consisting of groups represented by the following formulas:

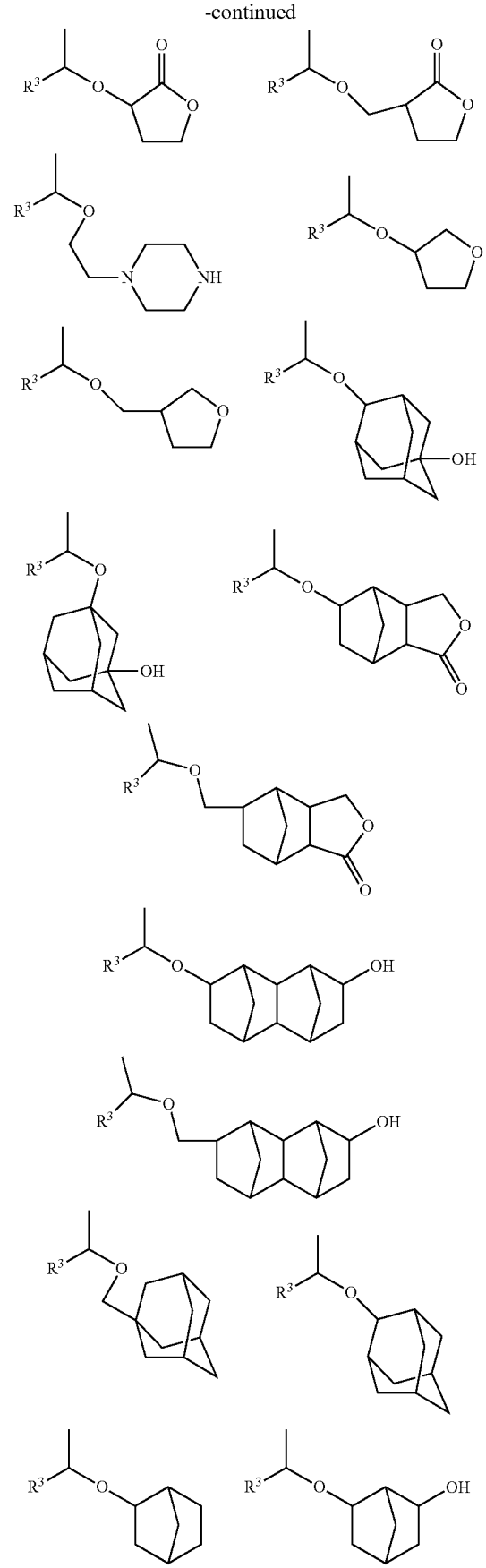

-continued
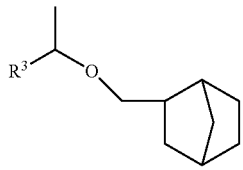 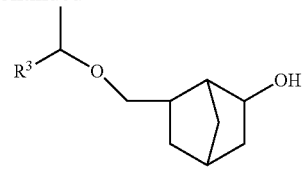
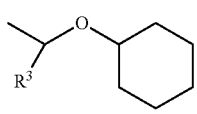 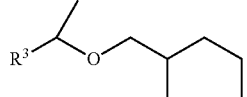
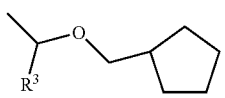 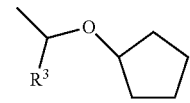
-continued
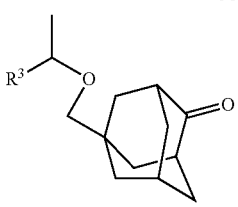 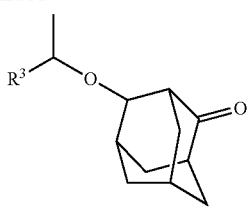
(wherein $R_3$ represents a hydrogen atom or a lower alkyl group).
* * * * *

UNITED STATES PATENT AND TRADEMARK OFFICE
CERTIFICATE OF CORRECTION

| | | |
|---|---|---|
| PATENT NO. | : 8,206,887 B2 | Page 1 of 1 |
| APPLICATION NO. | : 11/914451 | |
| DATED | : June 26, 2012 | |
| INVENTOR(S) | : Takako Hirosaki, Daiju Shiono and Taku Hirayama | |

It is certified that error appears in the above-identified patent and that said Letters Patent is hereby corrected as shown below:

Title page, (Item 56), Col. 2, Line 34, Under Other Publications, change "ISEEE" to --IEEE--.

At Column 1, Line 59, After "devices" insert --.--.

At Column 3, Line 57, Change "(A1)" to --(A1),--.

At Column 9, Line 15 (Approx.), Change "silicone" to --silicon--.

At Column 16, Line 21, Change "Of" to --of--.

At Column 16, Line 49, Change "Of" to --of--.

At Column 22, Line 40, After "group)" insert --.--.

At Column 23, Line 49, After "3]" insert --.--.

At Column 34, Line 20, After "58.43H)" insert --.--.

At Column 34, Line 48, Change "Eluant" to --Eluent--.

At Columns 37-38, Line 3 (Table 3), Change "15.7" to --16.7--.

At Column 38, Line 34, After "formed" insert --.--.

At Column 42, Line 1, In Claim 3, change "g'each" to --g' each--.

At Column 42, Line 2, In Claim 3, change "h'represents" to --h' represents--.

At Column 42, Line 8, In Claim 3, change "q'represents" to --q' represents--.

At Column 43, Line 9 (Approx.), In Claim 4, after "and" insert --o--.

At Column 43, Line 44 (Approx.), In Claim 4, change "g'each" to --g' each--.

At Column 43, Line 45 (Approx.), In Claim 4, change "h'represents" to --h' represents--.

At Column 44, Line 4, In Claim 4, change "q'represents" to --q' represents--.

Signed and Sealed this
Fourth Day of December, 2012

David J. Kappos
*Director of the United States Patent and Trademark Office*